(12) United States Patent
Takahashi

(10) Patent No.: US 10,957,842 B2
(45) Date of Patent: Mar. 23, 2021

(54) PIEZOELECTRIC DRIVE DEVICE, DRIVE METHOD OF PIEZOELECTRIC DRIVE DEVICE, ROBOT, ELECTRONIC COMPONENT TRANSPORT APPARATUS, PRINTER, AND PROJECTOR

(71) Applicant: Seiko Epson Corporation, Tokyo (JP)

(72) Inventor: Tomoaki Takahashi, Matsumoto (JP)

(73) Assignee: Seiko Epson Corporation

( * ) Notice: Subject to any disclaimer, the term of this patent is extended or adjusted under 35 U.S.C. 154(b) by 529 days.

(21) Appl. No.: 15/938,311

(22) Filed: Mar. 28, 2018

(65) Prior Publication Data
US 2018/0287042 A1    Oct. 4, 2018

(30) Foreign Application Priority Data

Mar. 31, 2017 (JP) .............................. JP2017-070930

(51) Int. Cl.
| | | |
|---|---|---|
| *H01L 41/04* | (2006.01) | |
| *H01L 41/09* | (2006.01) | |
| *H01L 41/047* | (2006.01) | |
| *H02N 2/02* | (2006.01) | |
| *H02N 2/00* | (2006.01) | |
| *H02N 2/10* | (2006.01) | |

(52) U.S. Cl.
CPC .......... *H01L 41/042* (2013.01); *H01L 41/047* (2013.01); *H01L 41/09* (2013.01); *H02N 2/0025* (2013.01); *H02N 2/0075* (2013.01); *H02N 2/026* (2013.01); *H02N 2/103* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,252,333 | B1* | 6/2001 | Iino | ...................... H01L 41/0913 310/323.17 |
| 2013/0140952 | A1* | 6/2013 | Kamijo | ................ B25J 15/0009 310/328 |
| 2015/0103424 | A1* | 4/2015 | Araki | ...................... H02N 2/026 359/824 |
| 2015/0158184 | A1* | 6/2015 | Kamijo | .................. H02N 2/004 74/490.05 |
| 2016/0241165 | A1* | 8/2016 | Miyazawa | ............. H02N 2/103 |

FOREIGN PATENT DOCUMENTS

| | | |
|---|---|---|
| JP | 2008-278676 A | 11/2008 |
| JP | 2014-126643 A | 7/2014 |
| JP | 2016-152705 A | 8/2016 |

* cited by examiner

*Primary Examiner* — Bryan P Gordon
(74) *Attorney, Agent, or Firm* — Harness, Dickey & Pierce, P.L.C.

(57) ABSTRACT

A piezoelectric drive device includes first and second piezoelectric vibration modules pressed toward a driven portion and including a vibration portion and a transmission portion abutting the driven portion and transmitting vibration to the driven portion and a controller. A pressing force of the second module to the driven portion is greater than that of the first module. The controller drives the second module so that the transmission portion of the second module performs longitudinal vibration vibrating in the pressing direction while driving the first module so that the transmission portion of the first module performs bending vibration that is a composite of longitudinal vibration in a pressing direction and lateral vibration intersecting the pressing direction.

20 Claims, 18 Drawing Sheets

PIEZOELECTRIC DRIVE DEVICE, DRIVE METHOD OF PIEZOELECTRIC DRIVE DEVICE, ROBOT, ELECTRONIC COMPONENT TRANSPORT APPARATUS, PRINTER, AND PROJECTOR

BACKGROUND

1. Technical Field

The present invention relates to a piezoelectric drive device, a drive method of the piezoelectric drive device, a robot, an electronic component transport apparatus, a printer, and a projector.

2. Related Art

The piezoelectric drive device described in JP-A-2016-152705 includes a rotor and a plurality of piezoelectric drive portions that abut the rotor. Further, it is possible to select a drive mode in which each piezoelectric drive portion is caused to elliptically vibrate in a forward direction, a drive mode in which the piezoelectric drive portion is caused to elliptically vibrate in a reverse direction, and a drive mode in which each piezoelectric drive portion is caused to longitudinally vibrate.

Here, as important parameters of the piezoelectric drive device, there are a drive force (force rotating the rotor) and a holding force (force holding the rotor). In a case where the holding force is increased, the number of the piezoelectric drive portions may be increased. However, when the number of the piezoelectric drive portions is simply increased, the drive force becomes excessively large.

SUMMARY

An advantage of some aspects of the invention is to provide a piezoelectric drive device which can increase a holding force without excessively increasing a drive force, a drive method of the piezoelectric drive device, and a robot, an electronic component transport apparatus, a printer, and a projector.

The advantage described above can be achieved by the following configuration.

A piezoelectric drive device according to an aspect of the invention includes a first piezoelectric vibration module and a second piezoelectric vibration module each of which is pressed toward a driven portion and includes a vibration portion and a transmission portion which abuts the driven portion and transmits vibration of the vibration portion to the driven portion, in which a pressing force of the second piezoelectric vibration module to the driven portion is greater than the pressing force of the first piezoelectric vibration module to the driven portion, the transmission portion of the first piezoelectric vibration module performs bending vibration that is composite vibration of longitudinal vibration vibrating in a pressing direction and lateral vibration vibrating in a direction intersecting the pressing direction, and the transmission portion of the second piezoelectric vibration module performs longitudinal vibration vibrating in the pressing direction.

With this configuration, it is possible to obtain a piezoelectric drive device capable of increasing the holding force without excessively increasing the drive force.

In the piezoelectric drive device according to the aspect of the invention, it is preferable that amplitude of the longitudinal vibration of the transmission portion of the second piezoelectric vibration module is preferably greater than amplitude of the longitudinal vibration of the transmission portion of the first piezoelectric vibration module in a state of being not pressed to the driven portion.

With this configuration, it is possible to more reliably reduce a frictional force between the second piezoelectric vibration module and the driven portion by causing the second piezoelectric vibration module to longitudinally vibrate. For that reason, it is possible to more smoothly move the driven portion by bending vibration of the first piezoelectric vibration module.

In the piezoelectric drive device according to the aspect of the invention, it is preferable that the vibration portions of the first piezoelectric vibration module and the vibration portion of the second piezoelectric vibration module have the same configuration.

With this configuration, the configuration of the piezoelectric drive device becomes simple.

In the piezoelectric drive device according to the aspect of the invention, it is preferable that the first piezoelectric vibration module and the second piezoelectric vibration module have at least a pair of vibration regions which is disposed in the vibration portion and disposed side by side in a direction intersecting the pressing direction, the first piezoelectric vibration module expands and contracts the pair of vibration regions at different phases to cause the transmission portion to perform the bending vibration and the second piezoelectric vibration module expands and contracts the pair of vibration regions at the same phase to cause the transmission portion to perform the longitudinal vibration.

With this configuration, it is possible to cause the first piezoelectric vibration module to bendingly vibrate and to cause the second piezoelectric vibration module to longitudinally vibrate, with a simple configuration.

In the piezoelectric drive device according to the aspect of the invention, it is preferable that the vibration portion of the first piezoelectric vibration module and the vibration portion of the second piezoelectric vibration module have configurations different from each other.

With this configuration, each of the first piezoelectric vibration module and the second piezoelectric vibration module can have a suitable configuration and thus, the piezoelectric drive device becomes able to be driven more efficiently.

In the piezoelectric drive device according to the aspect of the invention, it is preferable that an area of the vibration region that causes the longitudinal vibration of the second piezoelectric vibration module is greater than the area of the vibration region that causes the longitudinal vibration of the first piezoelectric vibration module.

With this configuration, it is possible to more reliably reduce a frictional force between the second piezoelectric vibration module and the driven portion by causing the second piezoelectric vibration module to longitudinally vibrate.

In the piezoelectric drive device according to the aspect of the invention, it is preferable that the second piezoelectric vibration module has one vibration region.

With this configuration, it is possible to increase the vibration region and it is possible to further increase the amplitude of the longitudinal vibration of the second piezoelectric vibration module.

In the piezoelectric drive device according to the aspect of the invention, it is preferable to include a first mode in which the driven portion is moved by causing the transmission portion of the second piezoelectric vibration module to perform the longitudinal vibration while causing the transmission portion of the first piezoelectric vibration module to perform the bending vibration and a second mode in which driving of the first piezoelectric vibration module and the second piezoelectric vibration module is stopped and the driven portion is held by the first piezoelectric vibration module and the second piezoelectric vibration module.

With this configuration, after the driven portion is moved to a predetermined position, it is possible to hold the driven portion at that position. For that reason, unintentional movement of the driven portion is suppressed and reliability of the piezoelectric drive device is improved.

In the piezoelectric drive device according to the aspect of the invention, it is preferable to include a third mode in which movement of the driven portion is allowed by causing the transmission portion of the first piezoelectric vibration module and the transmission portion of the second piezoelectric vibration module to perform the longitudinal vibration.

With this configuration, for example, the operator can manually (with his/her own hand) operate the driven portion and usability of the piezoelectric drive device is further improved.

A drive method of a piezoelectric drive device according to another aspect of the invention is a drive method of a piezoelectric drive device which includes a first piezoelectric vibration module and a second piezoelectric vibration module each of which is pressed toward a driven portion and includes a vibration portion and a transmission portion which abuts the driven portion and transmits vibration of the vibration portion to the driven portion, the drive method including, in a state where a pressing force of the second piezoelectric vibration module to the driven portion is greater than the pressing force of the first piezoelectric vibration module to the driven portion, causing the driven portion to be driven by allowing the transmission portion of the first piezoelectric vibration module to perform bending vibration that is composite vibration of longitudinal vibration vibrating in a pressing direction and lateral vibration vibrating in a direction intersecting the pressing direction and allowing the transmission portion of the second piezoelectric vibration module to perform longitudinal vibration that vibrates in the pressing direction.

With this configuration, it is possible to increase the holding force without excessively increasing the drive force.

A robot according to another aspect of the invention includes the piezoelectric drive device according to the aspect of the invention.

With this configuration, it is possible to achieve the effects of the piezoelectric drive device according to the aspect of the invention and obtain a highly reliable robot.

An electronic component transport apparatus according to another aspect of the invention includes the piezoelectric drive device according to the aspect of the invention.

With this configuration, it is possible to achieve the effects of the piezoelectric drive device according to the aspect of the invention and obtain a highly reliable electronic component transport apparatus.

A printer according to another aspect of the invention includes the piezoelectric drive device according to the aspect of the invention.

With this configuration, it is possible to achieve the effects of the piezoelectric drive device according to the aspect of the invention and obtain a highly reliable printer.

A projector according to another aspect of the invention includes the piezoelectric drive device according to the aspect of the invention.

With this configuration, it is possible to achieve the effects of the piezoelectric drive device according to the aspect of the invention and obtain a highly reliable projector.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a piezoelectric drive device, a drive method of the piezoelectric drive device, a robot, an electronic component transport apparatus, a printer, and a projector according to the invention will be described in detail based on embodiments illustrated in the accompanying drawings.

First Embodiment

First, a piezoelectric drive device according to a first embodiment of the invention will be described.

Figure 1:
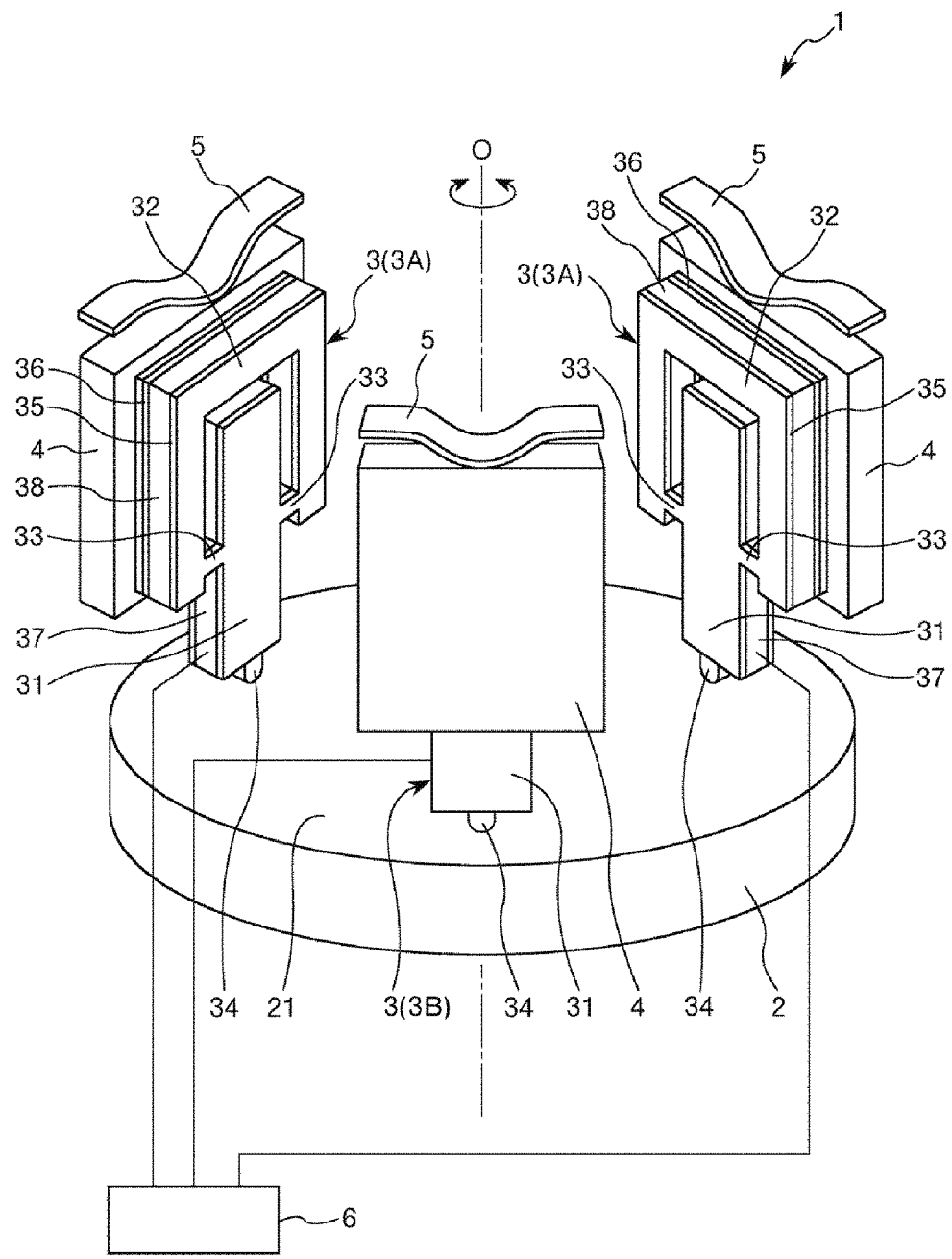
FIG. 1 is a perspective view illustrating a piezoelectric drive device according to a first embodiment of the invention.
Figure 2:
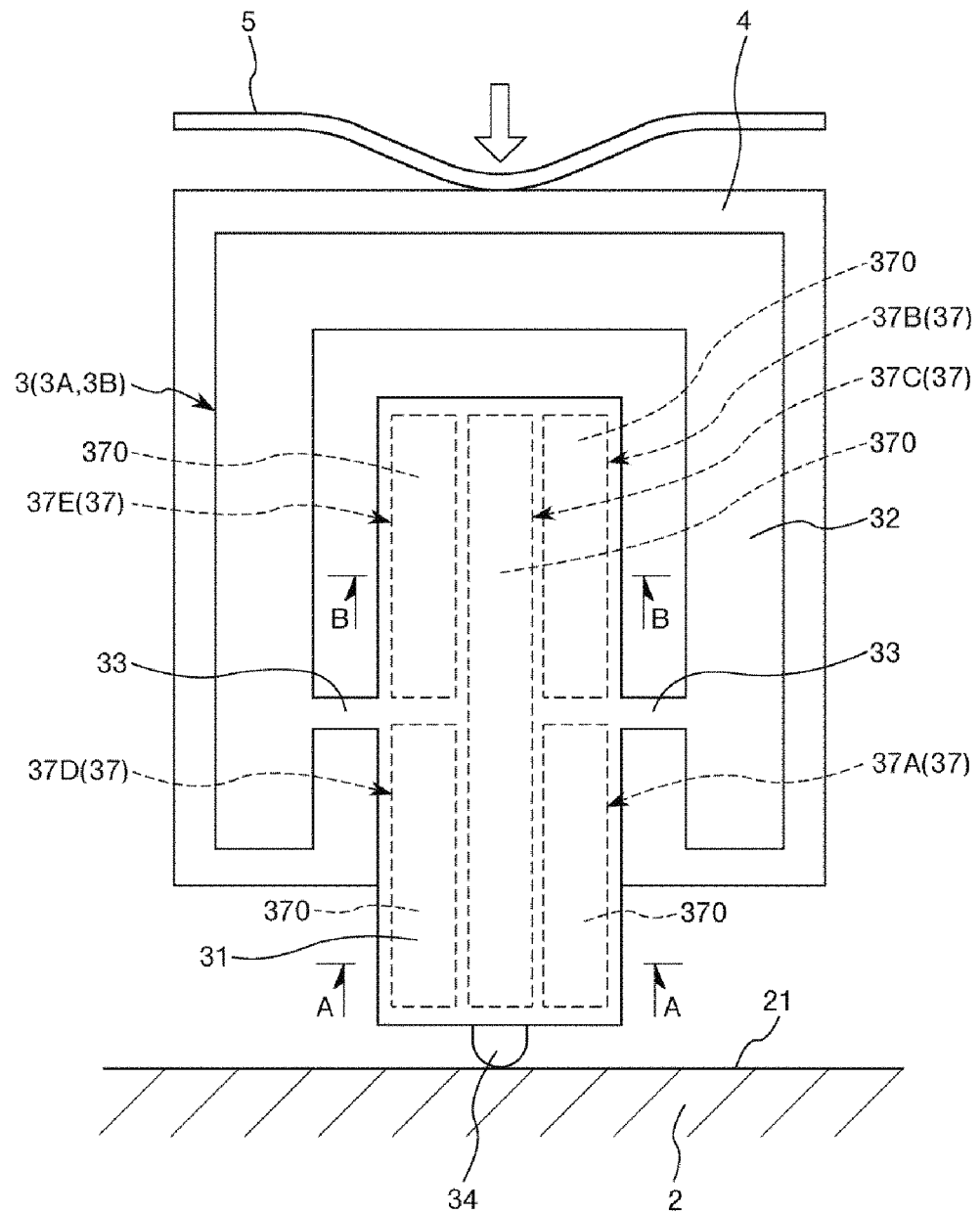
FIG. 2 is a plan view illustrating a piezoelectric vibration module included in the piezoelectric drive device illustrated in FIG. 1.
Figure 3:
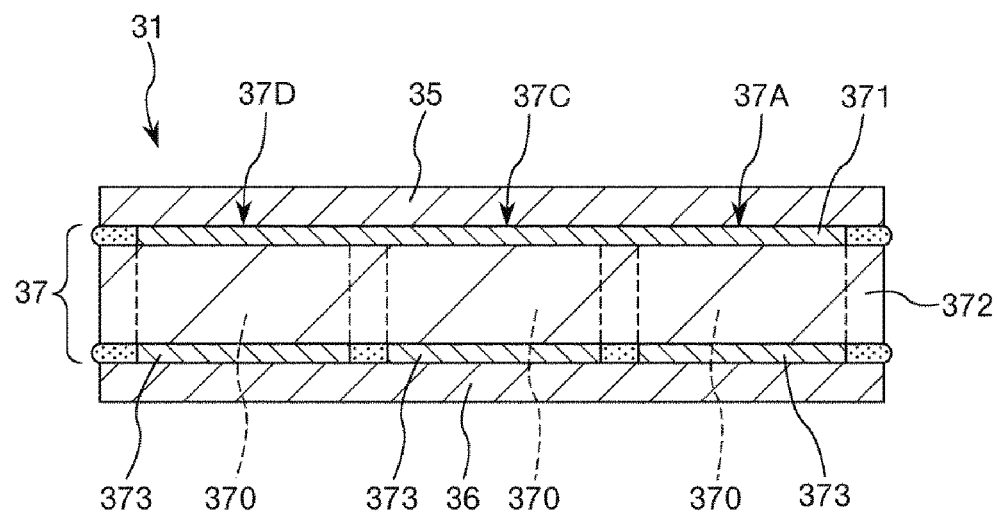
FIG. 3 is a cross-sectional view taken along line A-A in FIG. 2.
Figure 4:
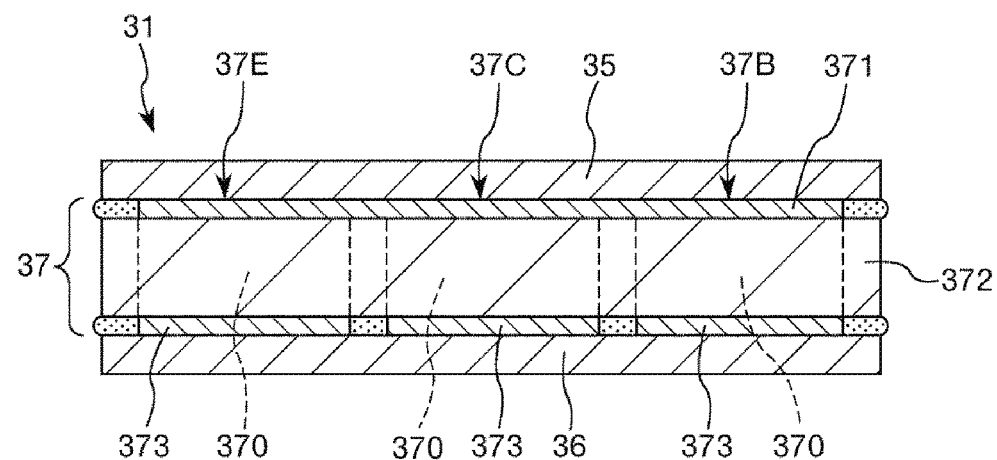
FIG. 4 is a cross-sectional view taken along line B-B in FIG. 2.
Figure 5:
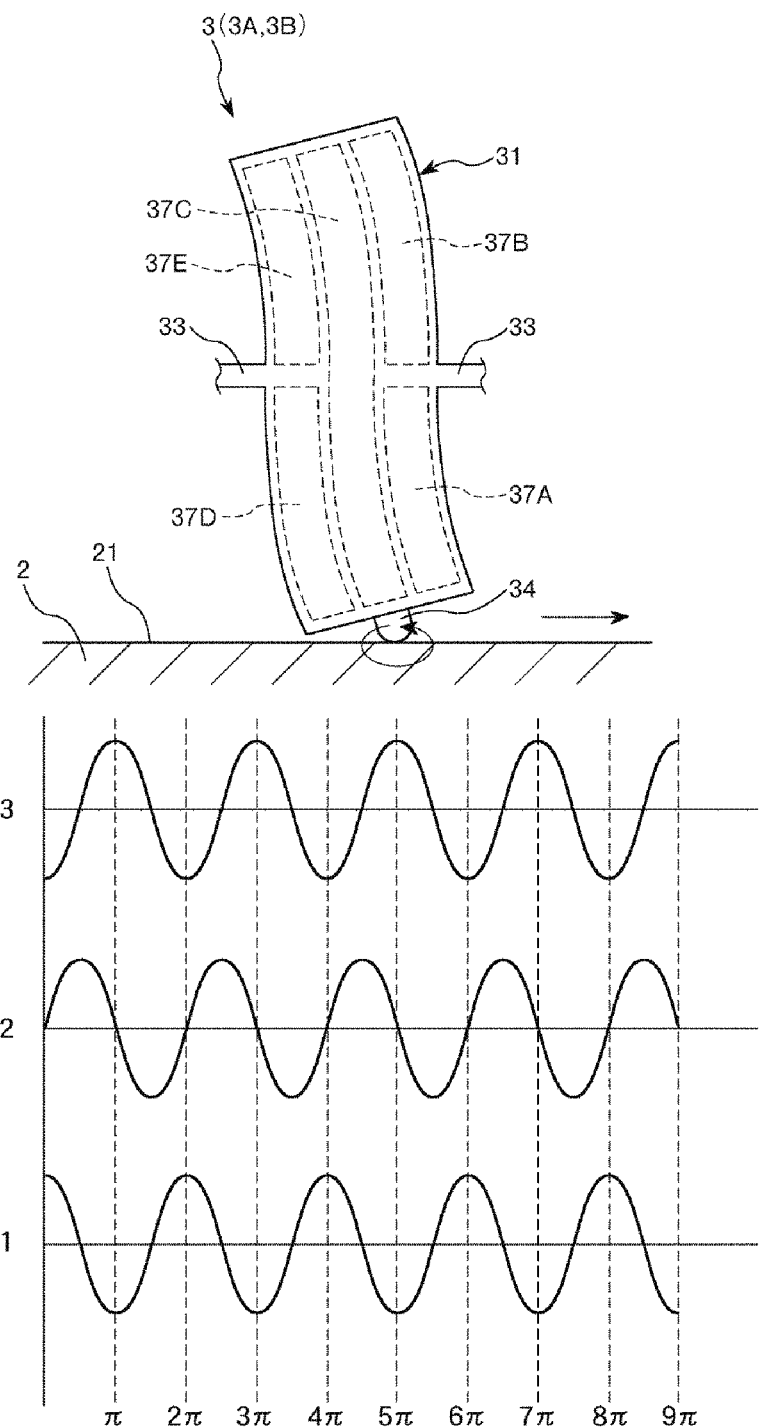
FIG. 5 is a diagram illustrating a forward rotation vibration mode of the piezoelectric vibration module illustrated in FIG. 2.
Figure 6:
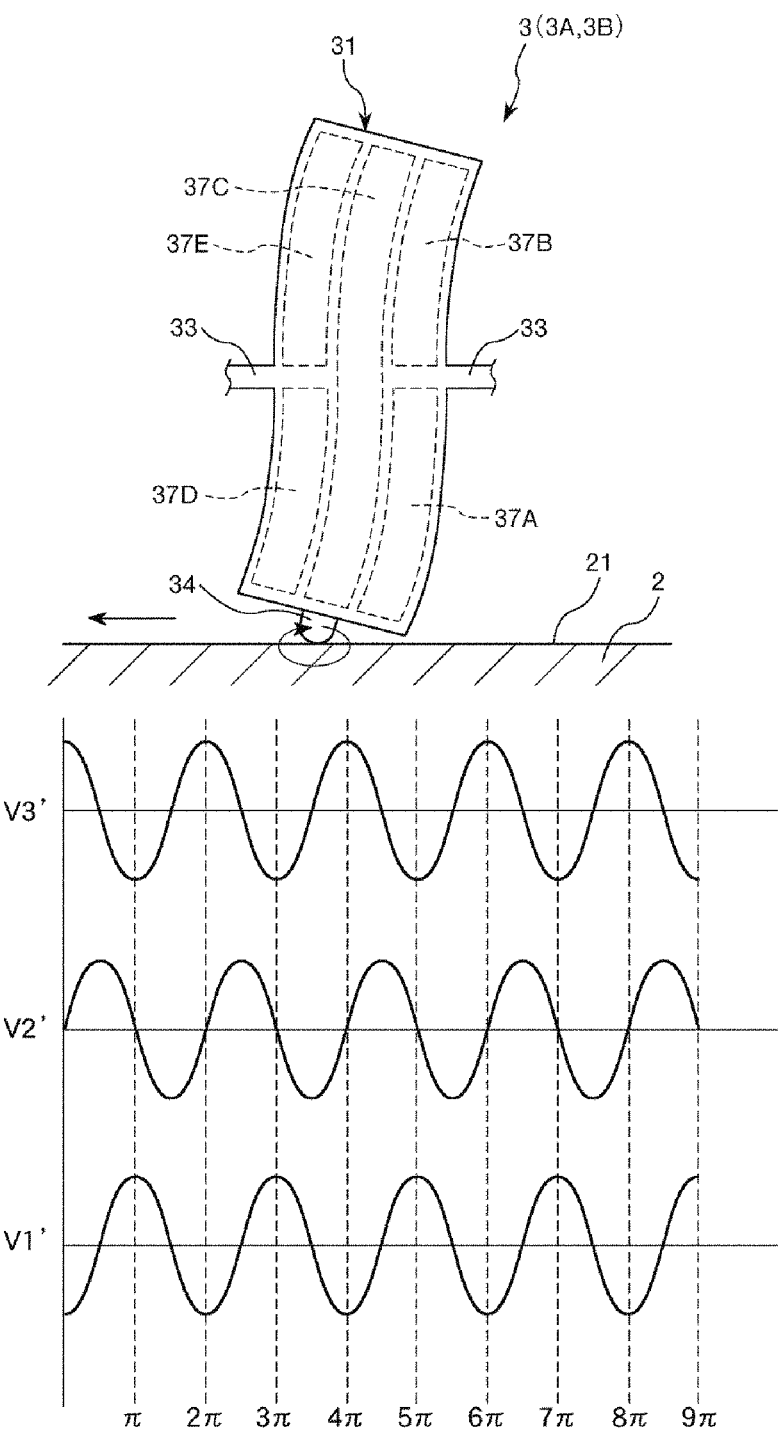
FIG. 6 is a view illustrating a reverse rotation vibration mode of the piezoelectric vibration module illustrated in FIG. 2.
Figure 7:
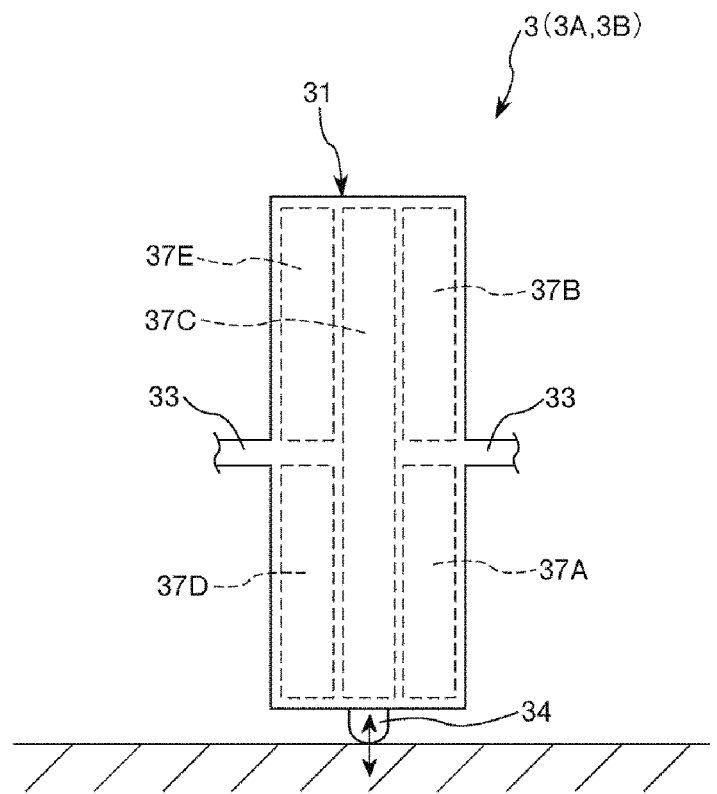
FIG. 7 is a diagram illustrating a longitudinal vibration mode of the piezoelectric vibration module illustrated in FIG. 2.
Figure 7:
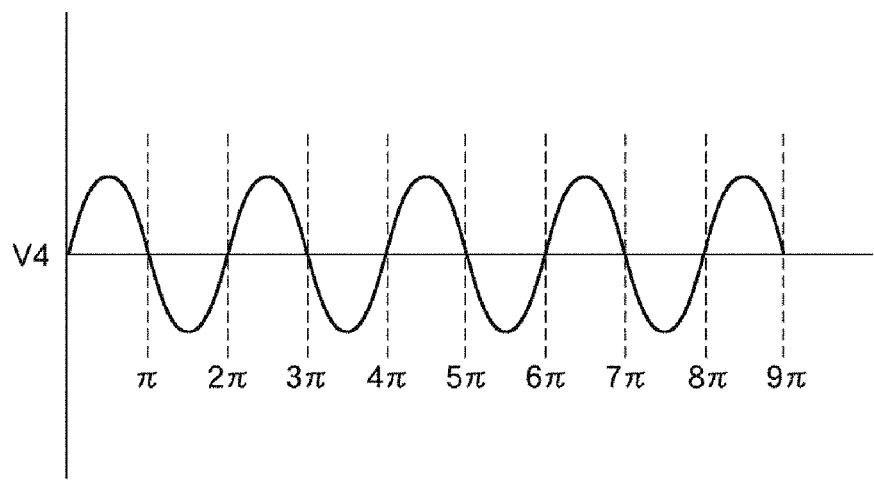
Figure 10:
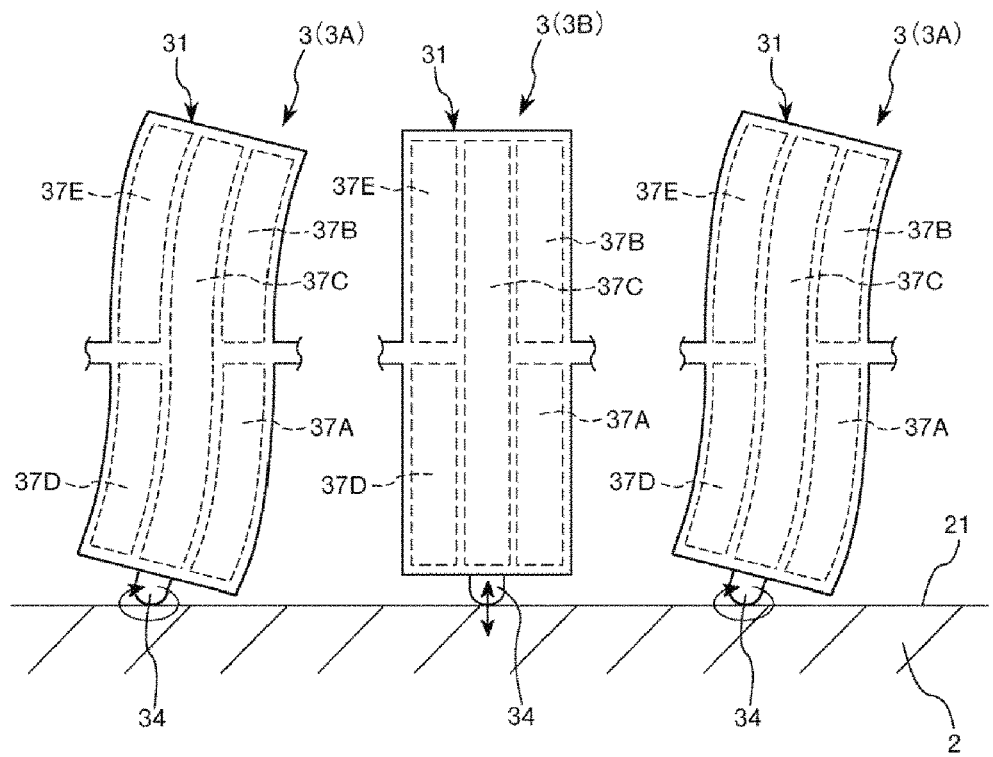
FIG. 10 is another diagram for explaining the drive method of the piezoelectric drive device illustrated in FIG. 1.
Figure 11:
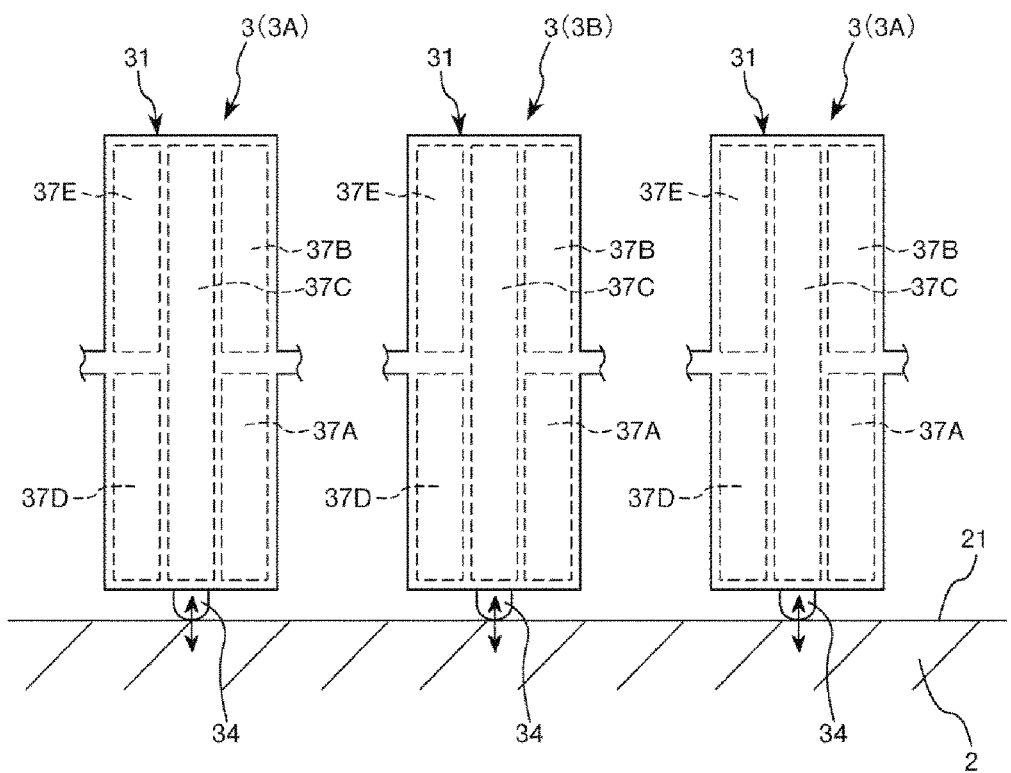
FIG. 11 is another diagram for explaining the drive method of the piezoelectric drive device illustrated in FIG. 1.
Figure 12:
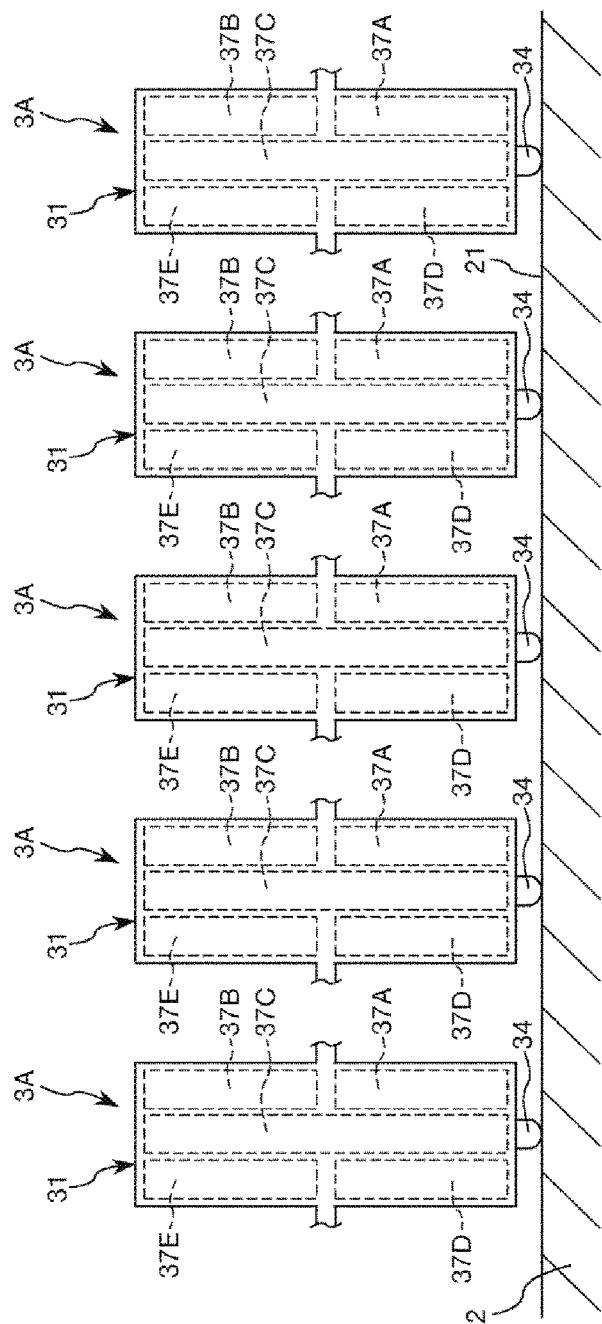
FIG. 12 is a table illustrating an example of a drive force and a holding force that can be realized by a configuration of the related art.
Figure 13:
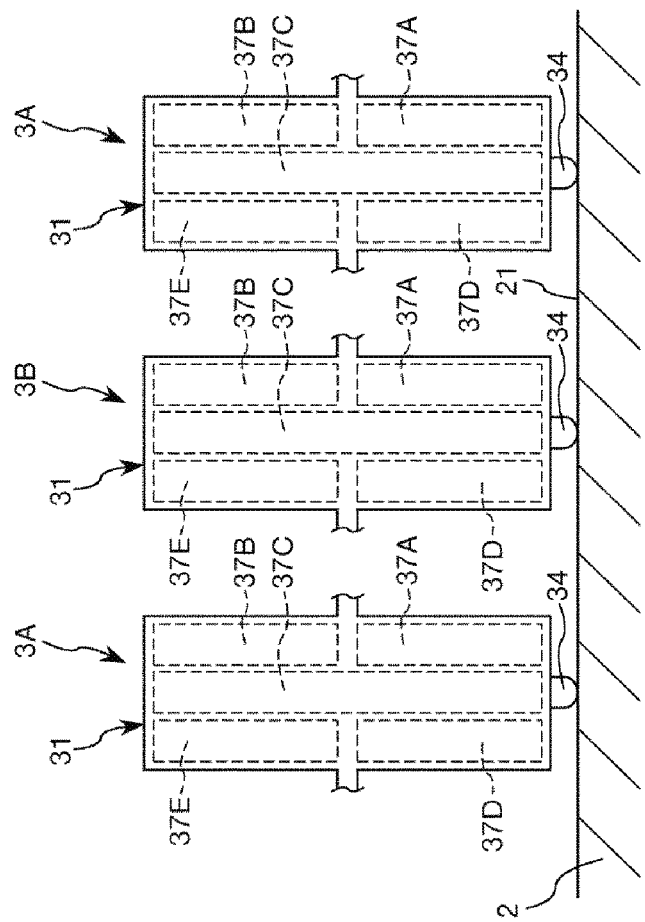
FIG. 13 is a table illustrating an example of a drive force and a holding force that can be realized by a configuration of the invention.

FIG. 1 is a perspective view illustrating a piezoelectric drive device according to a first embodiment of the invention. FIG. 2 is a plan view illustrating a piezoelectric vibration module included in the piezoelectric drive device illustrated in FIG. 1. FIG. 3 is a cross-sectional view taken along line A-A in FIG. 2. FIG. 4 is a cross-sectional view taken along line B-B in FIG. 2. FIG. 5 is a diagram illustrating a forward rotation vibration mode of the piezoelectric vibration module illustrated in FIG. 2. FIG. 6 is a view illustrating a reverse rotation vibration mode of the piezoelectric vibration module illustrated in FIG. 2. FIG. 7 is a diagram illustrating a longitudinal vibration mode of the piezoelectric vibration module illustrated in FIG. 2. Each of FIGS. 8 to 11 is a diagram for explaining a drive method of the piezoelectric drive device illustrated in FIG. 1. FIG. 12 is a table illustrating an example of a drive force and a holding force that can be realized by a configuration of the related art. FIG. 13 is a table illustrating an example of a drive force and a holding force that can be realized by a configuration of the invention. In the following description, for convenience of description, the upper side in FIGS. 1 to 13 is also referred to as "upper" and the lower side in FIGS. 1 to 13 is also referred to as "lower".

A piezoelectric drive device 1 illustrated in FIG. 1 is used as a rotary motor (ultrasonic motor), and includes a rotor 2 (driven portion) rotatable around a rotation axis O, a plurality of piezoelectric vibration modules 3 that abut on an upper surface 21 of the rotor 2, a stage 4 that supports each piezoelectric vibration module 3, an urging portion 5 that urges each piezoelectric vibration module 3 toward the rotor 2 via the stage 4, and a control unit 6 that independently controls driving of each piezoelectric vibration module 3. The plurality of piezoelectric vibration modules 3 include at least one first piezoelectric vibration module 3A and at least one second piezoelectric vibration module 3B.

The first piezoelectric vibration module 3A has both functions of a function as a drive unit that rotates (moves) the rotor 2 around the rotation axis O, a function as a holding portion that holds the rotor 2 in that state (that is, regulates movement). On the other hand, the second piezoelectric vibration module 3B substantially does not have a function as a drive portion for rotating the rotor 2 around the rotation axis O and only has a function as a holding portion for holding the rotor 2 in that state. That is, the piezoelectric drive device 1 is configured in such a way that the rotor 2 is rotated by the first piezoelectric vibration module 3A and the rotor 2 is held by the first piezoelectric vibration module 3A and the second piezoelectric vibration module 3B.

According to such a configuration, the rotor 2 is moved only by the first piezoelectric vibration module 3A and thus, it is possible to suppress excessive increase (more than necessary) of a drive force of the rotor 2. The rotor 2 is held by both the first piezoelectric vibration module 3A and the second piezoelectric vibration module 3B and thus, it is possible to further increase the holding force of the rotor 2. As will be described later, the second piezoelectric vibration module 3B is pressed against the rotor 2 with a greater force than the first piezoelectric vibration module 3A and a holding force greater than that of the first piezoelectric vibration module 3A that much of the force. For that reason, it is possible to reduce the number of piezoelectric vibration modules 3 required for exerting a holding force of a predetermined size and it is also possible to achieve miniaturization of the piezoelectric drive device 1. Hereinafter, such a piezoelectric drive device 1 will be described in detail.

The rotor 2 has a disc shape and is rotatably bearing supported around the rotation axis O. However, a configuration of the rotor 2 is not particularly limited.

A plurality of the piezoelectric vibration modules 3 are disposed to abut with the upper surface 21 of the rotor 2. Each of the plurality of piezoelectric vibration modules 3 includes at least one first piezoelectric vibration module 3A and at least one second piezoelectric vibration module 3B and these vibration modules are disposed around the rotation axis O. In the first embodiment, a configuration in which the plurality of piezoelectric vibration modules 3 includes two first piezoelectric vibration modules 3A and one second piezoelectric vibration module 3B is adopted. However, the number of the piezoelectric vibration modules 3 is not particularly limited, and the number of the first piezoelectric vibration module 3A and the second piezoelectric vibration module 3B included in the piezoelectric vibration module 3 is not particularly limited. Further, as long as the rotor 2 can be rotated, disposition of the first piezoelectric vibration module 3A and the second piezoelectric vibration module 3B is also not particularly limited.

Next, the configuration of the piezoelectric vibration module 3 will be briefly described. In the first embodiment, the configurations of the first piezoelectric vibration module 3A and the second piezoelectric vibration module 3B are the same and thus, the configuration of the "piezoelectric vibration module 3" will be described below.

As illustrated in FIG. 2, the piezoelectric vibration module 3 includes a vibration portion 31 capable of vibrating, a support portion 32 supporting the vibration portion 31, a pair of connection portions 33 connecting the vibration portion 31 and the support portion 32, and a transmission portion 34 provided in the vibration portion 31. The vibration portion 31 is formed in a substantially rectangular plate shape and a transmission portion 34 is provided at a tip portion thereof. Further, the support portion 32 has a U shape to surround a base end side of the vibration portion 31.

The piezoelectric vibration module 3 having such a configuration abuts against the upper surface 21 of the rotor 2 at the tip end of the transmission portion 34 and is fixed to the stage 4 at the support portion 32. The stage 4 is urged toward the rotor 2 side (lower side in FIG. 2) by the urging portion 5 such as a spring member (leaf spring, coil spring) or the like, so that the transmission portion 34 is in contact with the upper surface 21 of the rotor 2 with a sufficient frictional force. For that reason, slipping is suppressed and vibration of the vibration portion 31 can be efficiently transmitted to the rotor 2 via the transmission portion 34.

As illustrated in FIG. 1, the piezoelectric vibration module 3 has a first substrate 35 and a second substrate 36. The vibration portion 31 has a piezoelectric element 37 provided between the first substrate 35 and the second substrate 36 and the support portion 32 has a spacer 38 provided between the first substrate 35 and the second substrate 36. The spacer 38 functions as a spacer for aligning the thickness of the support portion 32 to the thickness of the vibration portion 31.

As illustrated in FIG. 2, the piezoelectric element 37 includes five piezoelectric elements 37A, 37B, 37C, 37D, and 37E. Then, the piezoelectric elements 37A and 37B are positioned on one side (right side in FIG. 2) in a width direction of the vibration portion 31 and are disposed side by side in a longitudinal direction of the vibration portion 31. The piezoelectric elements 37D and 37E are positioned on the other side (left side in FIG. 2) in the width direction of the vibration portion 31 and are disposed side by side in the longitudinal direction of the vibration portion 31. The piezoelectric element 37C is positioned at the center portion in the width direction of the vibration portion 31 and is disposed along the longitudinal direction of the vibration portion 31. The configuration of the piezoelectric element is not particularly limited, and for example, the piezoelectric element 37C may be omitted.

As illustrate in FIGS. 3 and 4, each of the five piezoelectric elements 37A, 37B, 37C, 37D, and 37E includes a piezoelectric body 372, a first electrode 371 provided on the upper surface of the piezoelectric body 372, and a second electrode 373 provided on the lower surface of the piezoelectric body 372. A region sandwiched between the first electrode 371 and the second electrode 373 of the piezoelectric body 372 corresponds to a vibration region 370.

The first electrode 371 is a common electrode commonly provided for the piezoelectric elements 37A, 37B, 37C, 37D, and 37E. On the other hand, the second electrode 373 is an individual electrode individually provided for each of the piezoelectric elements 37A, 37B, 37C, 37D, and 37E. Here, widths (lengths in the horizontal direction in FIG. 2) of the second electrodes 373 of the piezoelectric elements 37A, 37B, 37C, 37D, and 37E are substantially equal to each other. Also, the length (length in the vertical direction in FIG. 2) of each of the second electrodes 373 of the piezoelectric elements 37A, 37B, 37D, and 37E is approximately one half of the length of the second electrode 373 of the piezoelectric element 37C. However, the size of the second electrodes 373 of the piezoelectric elements 37A, 37B, 37C, 37D, and 37 E is not limited thereto.

The piezoelectric body 372 is provided integrally with the piezoelectric elements 37A, 37B, 37C, 37D, and 37E in common. The piezoelectric bodies 372 may be provided separately for each of the piezoelectric elements 37A, 37B, 37C, 37D, and 37E.

As an electric field in a direction along the thickness direction of the vibration portion 31 is applied, the piezoelectric body 372 expands and contracts in the direction along the longitudinal direction of the vibration portion 31. As constituent material of the piezoelectric body 372, for example, piezoelectric ceramics such as lead titanate zirconate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, lead scandium niobate, and the like can be used. The piezoelectric body 372 made of piezoelectric ceramics may be formed of, for example, a bulk material, or may be formed by a sol-gel method or a sputtering method. In addition to the piezoelectric ceramics described above, polyvinylidene fluoride, quartz, or the like may be used as the constituent material of the piezoelectric body 372.

In the piezoelectric vibration module 3 configured as described above, when a drive voltage supplied from a power supply unit (not illustrated) is applied between the first electrode 371 and the second electrode 373, each of the piezoelectric elements 37A, 37B, 37C, 37D, and 37E vibrates according to the pattern of the drive voltage and the entirety of the vibration portion 31 vibrates.

Next, a vibration mode of the piezoelectric vibration module 3 will be described. The piezoelectric vibration module 3 has a forward rotation vibration mode in which the transmission portion 34 rotates in a forward direction (first direction), a reverse rotation vibration mode in which the transmission portion 34 rotates in a reverse direction (second direction) which is a direction opposite to the forward direction, and a longitudinal vibration mode in which the transmission portion 34 vibrates in a longitudinal direction of the vibration portion 31 and is adapted to be able to select (switch) these vibration modes. However, regarding the second piezoelectric vibration module 3B, it is not necessary for the second piezoelectric vibration module 3B to switch to the forward rotation vibration mode or the reverse rotation vibration mode as long as the second piezoelectric vibration module 3B can be driven in the longitudinal vibration mode.

As illustrated in FIG. 5, the forward rotation vibration mode is a vibration mode in which the transmission portion 34 is caused to be elliptically moved counterclockwise in the figure. In order to perform such a rotational vibration mode, for example, the voltage V1 in FIG. 5 is applied to the piezoelectric elements 37A and 37E, the voltage V2 is applied to the piezoelectric element 37C, and the voltage V3 is applied to the piezoelectric elements 37B and 37D. With this, the vibration portion 31 performs lateral vibration that bends at second order in the width direction (direction intersecting (orthogonal to) the longitudinal direction) thereof while performing longitudinal vibration which expands and contracts in the longitudinal direction (alignment direction of the piezoelectric vibration module 3 and the rotor 2 and pressing direction by the urging portion 5) of the vibration portion 31. Such longitudinal vibration and lateral vibration are combined and the vibration portion 31 bends and vibrates in an S shape and accordingly, the transmission portion 34 performs counterclockwise rotation vibration (elliptical vibration) which is composite vibration of the longitudinal vibration and the lateral vibration. As such, it is possible to cause the transmission portion 34 to rotationally vibrate by expanding and contracting the piezoelectric elements 37A and 37E, the piezoelectric elements 37B and 37D, and the piezoelectric element 37C at different phases. However, a voltage pattern to be applied to the piezoelectric vibration module 3 is not particularly limited as long as it is possible to cause the transmission portion 34 to be elliptically moved counterclockwise.

As illustrated in FIG. 6, the reverse rotation vibration mode is a vibration mode in which the transmission portion 34 is caused to be elliptically moved clockwise in the figure. In order to perform such a rotational vibration mode, for example, the voltage V1' in FIG. 6 is applied to the piezoelectric elements 37A and 37E, the voltage V2' is applied to the piezoelectric element 37C, and the voltage V3' is applied to the piezoelectric elements 37B and 37D. With this, the vibration portion 31 performs lateral vibration that bends at second order in the width direction thereof while performing longitudinal vibration which expands and contracts in the longitudinal direction thereof. Such longitudinal vibration and lateral vibration are combined and the vibration portion 31 bends and vibrates in a reverse S shape and accordingly, the transmission portion 34 performs clockwise rotation vibration (elliptical vibration) which is composite vibration of the longitudinal vibration and the lateral vibration. As such, it is possible to cause the transmission portion 34 to rotationally vibrate by expanding and contracting the piezoelectric elements 37A and 37E, the piezoelectric elements 37B and 37D, and the piezoelectric element 37C at different phases. However, a voltage pattern to be applied to the piezoelectric vibration module 3 is not particularly limited as long as it is possible to cause the transmission portion 34 to be elliptically moved clockwise.

As illustrated in FIG. 7, the longitudinal vibration mode is a vibration mode in which the transmission portion 34 is caused to vibrate in the longitudinal direction (alignment direction of the piezoelectric vibration module 3 and the rotor 2 and pressing direction by the urging portion 5) of the vibration portion 31. In order to perform such a longitudinal vibration mode, for example, the voltage V4 in FIG. 7 is applied to each of the piezoelectric elements 37A, 37B, 37C, 37D, and 37E. With this, the vibration portion 31 performs longitudinal vibration that expands and contracts in the longitudinal direction thereof and accordingly, the transmission portion 34 performs longitudinal vibration. As such, it is possible to cause the transmission portion 34 to longitudinally vibrate by expanding and contracting the piezoelectric elements 37A, 37B, 37C, 37D, and 37E at the same phase. In particular, the voltage V4 is applied to the piezoelectric elements 37A, 37B, 37C, 37D, and 37E so as to make it possible to make amplitude of longitudinal vibration in the longitudinal vibration mode greater than amplitude of longitudinal vibration in the forward rotation vibration mode and the reverse rotation vibration mode. However, the voltage pattern to be applied to the piezoelectric vibration module 3 is not particularly limited as long as it is possible to cause the transmission portion 34 to be longitudinally vibrated.

The longitudinal vibration mode of the first embodiment is substantially a vibration mode including only longitudinal vibration. As such, the longitudinal vibration mode is preferably a vibration mode including only longitudinal vibration. However, as the longitudinal vibration mode, for example, lateral vibration having amplitude smaller than that of the forward rotation vibration mode and the reverse rotation vibration mode described above may be included. That is, a mode in which rotational vibration that generates a drive force smaller than that of the forward rotation vibration mode and the reverse rotation vibration mode is caused to be performed may be available.

The piezoelectric vibration module 3 has been described as above. The piezoelectric vibration module 3 is not particularly limited as long as it can be driven at the forward rotation vibration mode, the reverse rotation vibration mode, and the longitudinal vibration mode as described above. For example, the support portion 32 and the connection portion 33 may be omitted and the configuration of the piezoelectric element 37 (number and disposition of piezoelectric elements) is also not particularly limited. Further, the piezoelectric vibration module 3 may have, for example, a configuration in which a plurality of the piezoelectric vibration modules 3 of the first embodiment are stacked (superimposed). With this, the piezoelectric vibration module 3 having a greater drive force is obtained.

Next, a drive method of the piezoelectric drive device 1 will be described. The piezoelectric drive device 1 has a holding mode (first mode) for holding (restricting movement) the rotor 2, a drive mode (second mode) for rotating the rotor 2, and a manual mode (third mode) in which rotation of the rotor 2 is allowed and the rotor 2 can be manually rotated, and is able to select one of these modes. Selection of the holding mode, the drive mode, and the manual mode is performed by the control unit 6.

Figure 8:
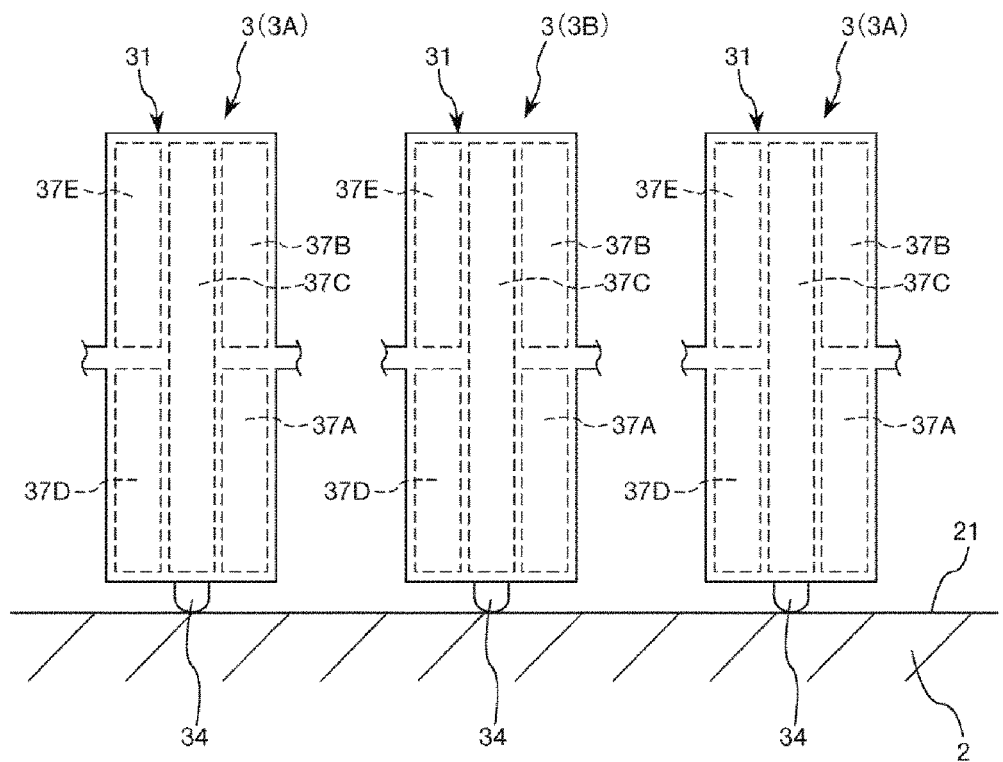
FIG. 8 is a diagram for explaining a drive method of the piezoelectric drive device illustrated in FIG. 1.

First, the holding mode will be described. The holding mode is a mode for restricting movement of the rotor 2. In this mode, as illustrated in FIG. 8, all the piezoelectric vibration modules 3 (first piezoelectric vibration module 3A and second piezoelectric vibration module 3B) stop driving (vibrating). As described above, each piezoelectric vibration module 3 is urged toward the rotor 2 by the urging portion 5 and each transmission portion 34 abuts the upper surface 21 of the rotor 2 with a sufficient frictional force. For that reason, in this state, the rotor 2 is held by each piezoelectric vibration module 3 and rotation (movement) of the rotor 2 is blocked. By having such a holding mode, it is possible to hold the rotor 2 at a predetermined position (rotation angle). Further, unintended movement of the rotor 2 can be suppressed and safety and usability (convenience) of the piezoelectric drive device 1 are improved.

Here, as described above, a pressing force of the second piezoelectric vibration module 3B to the rotor 2 is greater than the pressing force of the first piezoelectric vibration module 3A to the rotor 2. That is, the second piezoelectric vibration module 3B is pressed against the rotor 2 with a stronger force than the first piezoelectric vibration module 3A and the frictional force between the second piezoelectric vibration module 3B and the rotor 2 is greater than the frictional force between the first piezoelectric vibration module 3A and the rotor 2. With this, it is possible to reduce the number of piezoelectric vibration modules 3 necessary for obtaining a predetermined holding force, for example, as compared with the case where all the piezoelectric vibration modules 3 are pressed against the rotor 2 with the same force as in the conventional case. Accordingly, it is possible to achieve miniaturization of the piezoelectric drive device 1.

Although the pressing force of the second piezoelectric vibration module 3B to the rotor 2 is not particularly limited, when the pressing force of the second piezoelectric vibration module 3B to the rotor 2 is set to N2 and the pressing force of the first piezoelectric vibration module 3A to the rotor 2 is set to N1, it is more preferable that $2 \leq N2/N1 \leq 10$ is satisfied, and it is more preferable that $3 \leq N2/N1 \leq 5$ is satisfied. With this, it is possible to sufficiently increase the pressing force of the second piezoelectric vibration module 3B to the rotor 2. As described above, when the second piezoelectric vibration module 3B is caused to longitudinally vibrate, it is possible to sufficiently reduce the frictional force between the second piezoelectric vibration module 3B and the rotor 2, and in the drive mode, it is possible to smoothly move the rotor 2.

Figure 9:
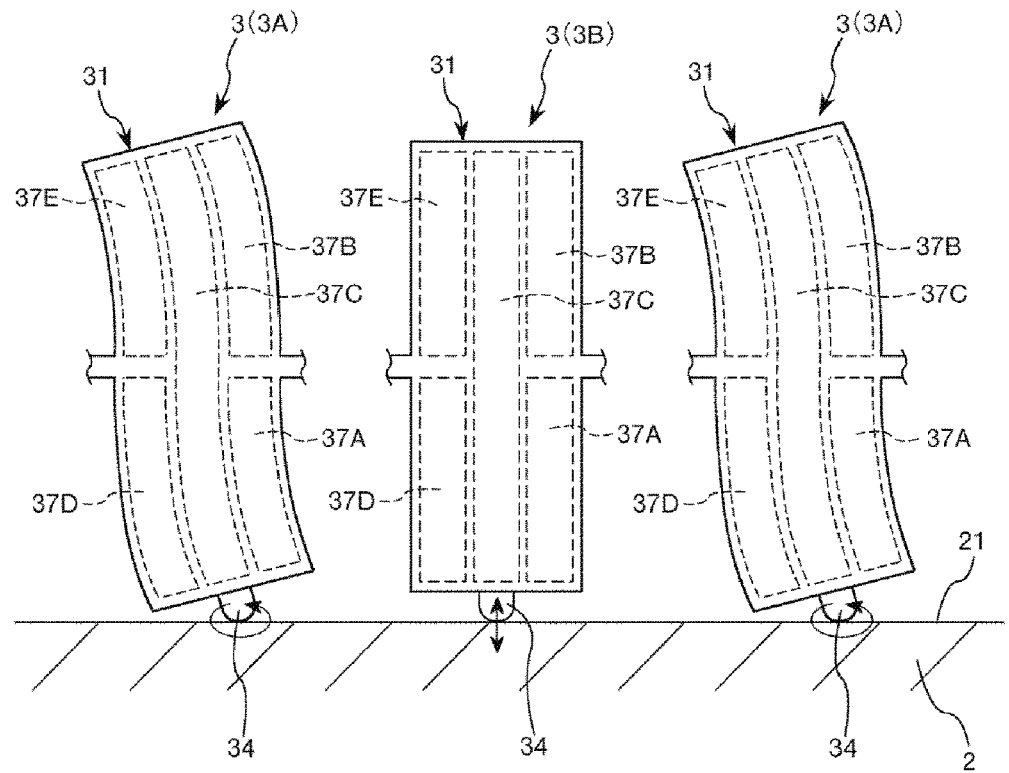
FIG. 9 is another diagram for explaining the drive method of the piezoelectric drive device illustrated in FIG. 1.

Next, the drive mode will be described. The drive mode is a mode in which each piezoelectric vibration module 3 is driven (vibrated) to rotate the rotor 2. In this mode, as illustrated in FIG. 9, the first piezoelectric vibration module 3A is driven at the rotational vibration mode and the second piezoelectric vibration module 3B is driven at the longitudinal vibration mode. With this, the rotor 2 is sent out by the transmission portion 34 of the first piezoelectric vibration module 3A and the rotor 2 rotates (is driven) around the rotation axis O. The longitudinal vibration mode occurring in the second piezoelectric vibration module 3B is vibration that substantially does not generate a drive force for rotating the rotor 2 but allows rotation of the rotor 2. As such, the second piezoelectric vibration module 3B is not used as a drive unit for moving the rotor 2 so as to make it possible to suppress excessive increase (more than necessary) of the drive force of the rotor 2.

Here, the reason why the second piezoelectric vibration module 3B is caused to longitudinally vibrate during the drive mode will be described. As described above, the second piezoelectric vibration module 3B is urged toward the rotor 2 and in a non-driving state, the transmission portion 34 of the second piezoelectric vibration module 3B abuts the rotor 2 with a sufficient frictional force. For that reason, when the second piezoelectric vibration module 3B is not driven (vibrated), there is a concern that the second piezoelectric vibration module 3B becomes a resistance (brake) and the rotor 2 cannot be rotated even when it is attempted to rotate the rotor 2 by driving the first piezoelectric vibration module 3A or a rotation speed of the rotor 2 is lowered even when the rotor 2 is rotated.

Thus, regarding the second piezoelectric vibration module 3B which does not generate the drive force, it is necessary to reduce the frictional force with the rotor 2 and to allow the rotation of the rotor 2, which is realized by the longitudinal vibration mode. This vibration mode corresponds to reciprocating vibration in the direction approaching and separating from the rotor 2 and thus, the frictional force with the rotor 2 decreases (the frictional force becomes 0 when the transmission portion 34 moves away from the rotor 2) when vibration is performed in the direction separating from the rotor 2. For that reason, the frictional force between the transmission portion 34 and the rotor 2 is smaller than that in the stopped state (non-driven state) on average, so that the movement of the rotor 2 can be allowed. It is preferable that the second piezoelectric vibration module 3B has a time to separate from the rotor 2 at the longitudinal vibration mode. With this, it is possible to further reduce an average frictional force between the transmission portion 34 and the rotor 2.

Here, longitudinal vibration is caused by expansion and contraction of the piezoelectric elements 37A, 37B, 37C, 37D, and 37E in the second piezoelectric vibration module 3B, whereas longitudinal vibration is caused by expansion and contraction of the piezoelectric element 37C in the first piezoelectric vibration module 3A. For that reason, even when the voltages (voltages V1, V2, and V3 in FIG. 5 and voltage V4 in FIG. 7) applied to the first piezoelectric vibration module 3A and the second piezoelectric vibration module 3B are the same magnitude, the amplitude of the longitudinal vibration of the transmission portion 34 of the second piezoelectric vibration module 3B becomes greater than the amplitude of the longitudinal vibration of the transmission portion 34 of the first piezoelectric vibration module 3A in the state where the transmission portion 34 is not in contact with the rotor 2 (natural state of not being contact with another member). In the first embodiment, the total of the sizes of the vibration regions 370 of the piezoelectric elements 37A, 37B, 37C, 37D, and 37E is approximately three times the vibration region 370 of the piezoelectric element 37C and thus, the amplitude of the longitudinal vibration of the transmission portion 34 of the second piezoelectric vibration module 3B is approximately three times the amplitude of the longitudinal vibration of the transmission portion 34 of the first piezoelectric vibration module 3A.

As such, the amplitude of the longitudinal vibration of the transmission portion 34 of the second piezoelectric vibration module 3B is greater than the amplitude of the longitudinal vibration of the transmission portion 34 of the first piezoelectric vibration module 3A and thus, even if the pressing force of the second piezoelectric vibration module 3B against the rotor 2 is greater than the pressing force of the first piezoelectric vibration module 3A against the rotor 2, it is possible to sufficiently lower the frictional force between the second piezoelectric vibration module 3B and the rotor 2 when the second piezoelectric vibration module 3B is caused to longitudinally vibrate. In other words, the amplitude of the longitudinal vibration of the transmission portion 34 of the second piezoelectric vibration module 3B is greater than the amplitude of the longitudinal vibration of the transmission portion 34 of the first piezoelectric vibration module 3A and thus, it is possible to make the pressing force of the second piezoelectric vibration module 3B to the rotor 2 greater than the pressing force of the first piezoelectric vibration module 3A against the rotor 2.

Here, although the amplitude of the longitudinal vibration of the transmission portion 34 of the second piezoelectric vibration module 3B in the natural state is not particularly limited, when the amplitude of the longitudinal vibration of the transmission portion 34 of the second piezoelectric vibration module 3B is set to G2 and the amplitude of the longitudinal vibration of the transmission portion 34 of the first piezoelectric vibration module 3A is set to G1, it is preferable that $2 \leq G2/G1 \leq 10$ is satisfied and it is more preferable that $3 \leq G2/G1 \leq 5$ is satisfied. With this, it is possible to make the amplitude G2 sufficiently large and to lower the frictional force between the second piezoelectric vibration module 3B and the rotor 2 sufficiently and more reliably by causing the second piezoelectric vibration module 3B to be longitudinally vibrated. It is possible to prevent the amplitude G2 from becoming excessively large, for example, it is possible to suppress breakage of the second piezoelectric vibration module 3B, increase in power consumption, and the like.

When it is set that a ratio (N2/N1) of the pressing forces N1 and N2 is set to N and a ratio of the amplitudes G1 and G2 (G2/G1) is set to G, for example, it is preferable that $0.5\,G \leq N \leq G$ is satisfied, and it is more preferable that $0.6\,G \leq N \leq 0.9\,G$ is satisfied. With this, it possible to sufficiently increase the pressing force N2 of the second piezoelectric vibration module 3B against the rotor 2. For that reason, it is possible to reduce the number of piezoelectric vibration modules 3 required to obtain a predetermined holding force in the holding mode. Accordingly, it is possible to achieve miniaturization of the piezoelectric drive device 1. It is possible to secure amplitude G2 to the extent that the transmission portion 34 of the second piezoelectric vibration module 3B can be separated from the rotor 2. For that reason, when the second piezoelectric vibration module 3B is caused to longitudinally vibrate, it possible to further reduce the frictional force between the second piezoelectric vibration module 3B and the rotor 2. For that reason, in the drive mode, it is possible to more smoothly rotate the rotor 2.

The drive mode has been described as above. In the first embodiment, although the configuration in which all the first piezoelectric vibration modules 3A are driven in the forward rotation vibration mode, as the drive mode, has been described, when at least one first piezoelectric vibration module 3A is driven in the forward rotation vibration mode, other first piezoelectric vibration modules 3A may be driven in the longitudinal vibration mode. As such, some of the first piezoelectric vibration modules 3A are driven in the longitudinal vibration mode so as to make it possible to reduce the rotation speed and the torque of the rotor 2. In the first embodiment, although the configuration in which all the first piezoelectric vibration modules 3A are driven in the forward rotation vibration mode, as the drive mode, has been described, in contrast, as illustrated in FIG. 10, all the first piezoelectric vibration modules 3A may be driven in the reverse rotation vibration mode. With this, it is possible to rotate the rotor 2 in the reverse direction.

Next, the manual mode will be described. The manual mode is a mode in which each piezoelectric vibration module 3 is driven (vibrated) so that the rotor 2 can be freely moved manually. In this mode, as illustrated in FIG. 11, all the piezoelectric vibration modules 3 (first piezoelectric vibration module 3A and second piezoelectric vibration module 3B) are driven in the longitudinal vibration mode. With this, it is possible to reduce the frictional force between all the piezoelectric vibration modules 3 and the rotor 2 and to manually move the rotor 2. In the manual mode, the first piezoelectric vibration module 3A performs longitudinal vibration instead of rotational vibration and thus, rotation of the rotor 2 due to the vibration of the first piezoelectric vibration module 3A does not substantially occur.

Such a manual mode can be suitably used for, for example, a case where the operator wants to operate the rotor 2 manually (with his/her own hand) or a case of teaching (storing) the movement of the rotor 2 to the control unit 6 of the piezoelectric drive device 1.

The piezoelectric drive device 1 has been described as above. As described above, such a piezoelectric drive device 1 includes the first piezoelectric vibration module 3A and the second piezoelectric vibration module 3B each of which is pressed toward the rotor 2 (driven portion) and includes the vibration portion 31 and the transmission portion 34 that abuts the rotor 2 and transmits vibration of the vibration portion 31 to the rotor 2. The pressing force of the second piezoelectric vibration module 3B to the rotor 2 is greater than the pressing force of the first piezoelectric vibration module 3A to the rotor 2. The transmission portion 34 of the first piezoelectric vibration module 3A performs rotational vibration (bending vibration) that is composite vibration of longitudinal vibration vibrating in a pressing direction (longitudinal direction of the vibration portion 31) and lateral vibration vibrating in a direction (width direction of the vibration portion 31) intersecting the pressing direction and the transmission portion 34 of the second piezoelectric vibration module 3B performs longitudinal vibration that vibrates in the pressing direction (longitudinal direction of the vibration portion 31). According to such a configuration, the rotor 2 is moved only by the first piezoelectric vibration module 3A and thus, it is possible to suppress excessive increase of the drive force of the rotor 2. The rotor 2 is held by both the first piezoelectric vibration module 3A and the second piezoelectric vibration module 3B and thus, it is possible to further increase the holding force of the rotor 2. That is, it is possible to obtain the piezoelectric drive device 1 capable of increasing the holding force without excessively increasing the drive force. Furthermore, the second piezoelectric vibration module 3B is pressed against the rotor 2 with a greater force than the first piezoelectric vibration module 3A and thus, it is possible to exert a holding force greater than the first piezoelectric vibration module 3A. For that reason, it is possible to reduce the number of piezoelectric vibration modules 3 required for exerting a holding force of a predetermined size and it is also possible to achieve miniaturization of the piezoelectric drive device 1.

The effects described above will be described more clearly based on FIGS. 12 and 13. FIG. 12 illustrates a configuration in which five first piezoelectric vibration modules 3A (five piezoelectric vibration modules 3) are provided as the configuration of the related art, and FIG. 13 illustrates a configuration of the invention in which two first piezoelectric vibration modules 3A and one second piezoelectric vibration module 3B (three piezoelectric vibration modules 3) are provided. In both configurations, the coefficient of friction between the piezoelectric vibration module 3 and the rotor 2 is 0.3, 3(N) is required as the holding force of the rotor 2, and 1.2(N) is required as the drive force of the rotor 2. The pressing force of the first piezoelectric vibration module 3A to the rotor 2 is 2(N) and the pressing force of the second piezoelectric vibration module 3B to the rotor 2 is 6(N).

In the configuration of the related art illustrated in FIG. 12, 3(N) which is a target value of the holding force of the rotor 2 is secured by the five first piezoelectric vibration modules 3A. On the other hand, the drive force of the rotor 2 greatly exceeds the target value of 1.2(N) by the five first piezoelectric vibration modules 3A and the drive force is 3(N). In this case, the drive force becomes excessively large (resulting in over-specification) and the piezoelectric drive device 1 becomes difficult to use. Five piezoelectric vibration modules 3 are used and thus, the piezoelectric drive device 1 is increased in size and cost as compared with the configuration of the invention illustrated in FIG. 13.

In contrast, in the configuration of the invention illustrated in FIG. 13, 3(N) which is a target value of the holding force of the rotor 2 is secured by the two first piezoelectric vibration modules 3A and one second piezoelectric vibration module 3B. On the other hand, the drive force of the rotor 2 which is the target value of 1.2(N) is secured by the two first piezoelectric vibration modules 3A. With this, both the holding force and the drive force become the target values and the piezoelectric drive device 1 is extremely easy to use. The three piezoelectric vibration modules 3 are used and thus, the piezoelectric drive device can be reduced in size and cost as compared with the configuration of the related art illustrated in FIG. 12. As such, according to the piezoelectric drive device 1, it is possible to increase the holding force without excessively increasing the drive force.

As described above, in the drive method of the piezoelectric drive device 1 which includes the first piezoelectric vibration module 3A and the second piezoelectric vibration module 3B each of which is pressed toward the rotor 2 (driven portion) and includes the vibration portion 31 and the transmission portion 34 which abuts the rotor 2 and transmits vibration of the vibration portion 31 to the rotor 2, in a state where the pressing force of the second piezoelectric vibration module 3B to the rotor 2 is greater than the pressing force of the first piezoelectric vibration module 3A to the rotor 2, the rotor 2 is rotated (driven) by allowing the transmission port ion 34 of the first piezoelectric vibration module 3A to perform rotational vibration (bending vibration) that is composite vibration of longitudinal vibration vibrating in a pressing direction (longitudinal direction of the vibration portion 31) and lateral vibration vibrating in a direction (width direction of the vibration portion 31) intersecting the pressing direction and also allowing the transmission portion 34 of the second piezoelectric vibration module 3B to perform longitudinal vibration that vibrates in the pressing direction (longitudinal direction of the vibration portion 31). According to such a drive method, the rotor 2 is rotated only by the first piezoelectric vibration module 3A and thus, it is possible to suppress excessive increase of the drive force of the rotor 2. The rotor 2 is held by both the first piezoelectric vibration module 3A and the second piezoelectric vibration module 3B and thus, it is possible to further increase the holding force of the rotor 2. That is, it is possible to increase the holding force without excessively increasing the drive force. Furthermore, the second piezoelectric vibration module 3B is pressed against the rotor 2 with a greater force than the first piezoelectric vibration module 3A and thus, it is possible to exert a holding force greater than the first piezoelectric vibration module 3A. For that reason, it is possible to reduce the number of piezoelectric vibration modules 3 required for exerting the holding force of predetermined magnitude and to achieve miniaturization of the piezoelectric drive device 1.

As described above, in the piezoelectric drive device 1, amplitude of the longitudinal vibration of the transmission portion 34 of the second piezoelectric vibration module 3B is greater than amplitude of the longitudinal vibration of the transmission portion 34 of the first piezoelectric vibration module 3A, in a state (natural state) of being not pressed to the rotor 2. With this, it is possible to more reliably reduce the frictional force between the second piezoelectric vibration module 3B and the rotor 2 by causing the second piezoelectric vibration module 3B to longitudinally vibrate. For that reason, it is possible to more smoothly move the rotor 2 by rotational vibration of the first piezoelectric vibration module 3A.

As described above, in the piezoelectric drive device 1, the vibration portion 31 of the first piezoelectric vibration module 3A and the vibration portion 31 of the second piezoelectric vibration module 3B have the same configuration. With this, the configuration of the piezoelectric drive device 1 is simple. The "same configuration" means that both the first piezoelectric vibration module 3A and the second piezoelectric vibration module 3B can vibrate in the longitudinal vibration mode and the rotational vibration mode. For that reason, for example, the overall configuration of the first piezoelectric vibration module 3A and the second piezoelectric vibration module 3B may be different from each other as long as the piezoelectric vibration modules 3A and 3B can vibrate in the longitudinal vibration mode and the rotational vibration mode. For example, one of the first piezoelectric vibration module 3A and the second piezoelectric vibration module 3B may not have the support portion 32 and the connection portion 33, may have a different shape, and disposition of the piezoelectric elements 37 in the vibration portion 31 may also be different from each other.

As described above, in the piezoelectric drive device 1, the first piezoelectric vibration module 3A and the second piezoelectric vibration module 3B have at least a pair of vibration regions 370 which is disposed in the vibration portion 31 and disposed side by side in the direction (width direction of the vibration portion 31) intersecting the pressing direction (longitudinal direction of the vibration portion 31). Then, the first piezoelectric vibration module 3A expands and contracts the pair of vibration regions 370 at different phases so as to cause the transmission portion 34 to rotationally vibrate and the second piezoelectric vibration module 3B expands and contracts the pair of vibration regions 370 at the same phase so as to cause the transmission portion 34 to longitudinally vibrate. With this, it is possible to cause the first piezoelectric vibration module 3A to rotationally vibrate and to cause the second piezoelectric vibration module 3B to longitudinally vibrate with a simple configuration.

As described above, the piezoelectric drive device 1 has a drive mode (first mode) in which the rotor 2 is moved by causing the transmission portion 34 of the second piezoelectric vibration module 3B to longitudinally vibrate while causing the transmission portion 34 of the first piezoelectric vibration module 3A to rotationally vibrate and a holding mode (second mode) in which driving of the first piezoelectric vibration module 3A and the second piezoelectric vibration module 3B is stopped and the rotor 2 is held by the first piezoelectric vibration module 3A and the second piezoelectric vibration module 3B. With this, after the rotor 2 is moved to a predetermined position, it is possible to hold the rotor 2 at that position. For that reason, unintentional movement of the rotor 2 is suppressed and reliability of the piezoelectric drive device 1 is improved.

As described above, the piezoelectric drive device 1 further has a manual mode (third mode) in which movement of the rotor 2 is allowed by causing the transmission portion 34 of the first piezoelectric vibration module 3A and the transmission portion 34 of the second piezoelectric vibration module 3B to longitudinally vibrate. With this, for example, the operator can operate the rotor 2 manually (with his/her own hand) and usability of the piezoelectric drive device 1 is further improved. Further, the manual mode can be suitably used for a case of teaching (storing) the movement of the rotor 2 to the control unit 6 of the piezoelectric drive device 1.

Second Embodiment

Next, a piezoelectric drive device according to a second embodiment of the invention will be described.

Figure 14:
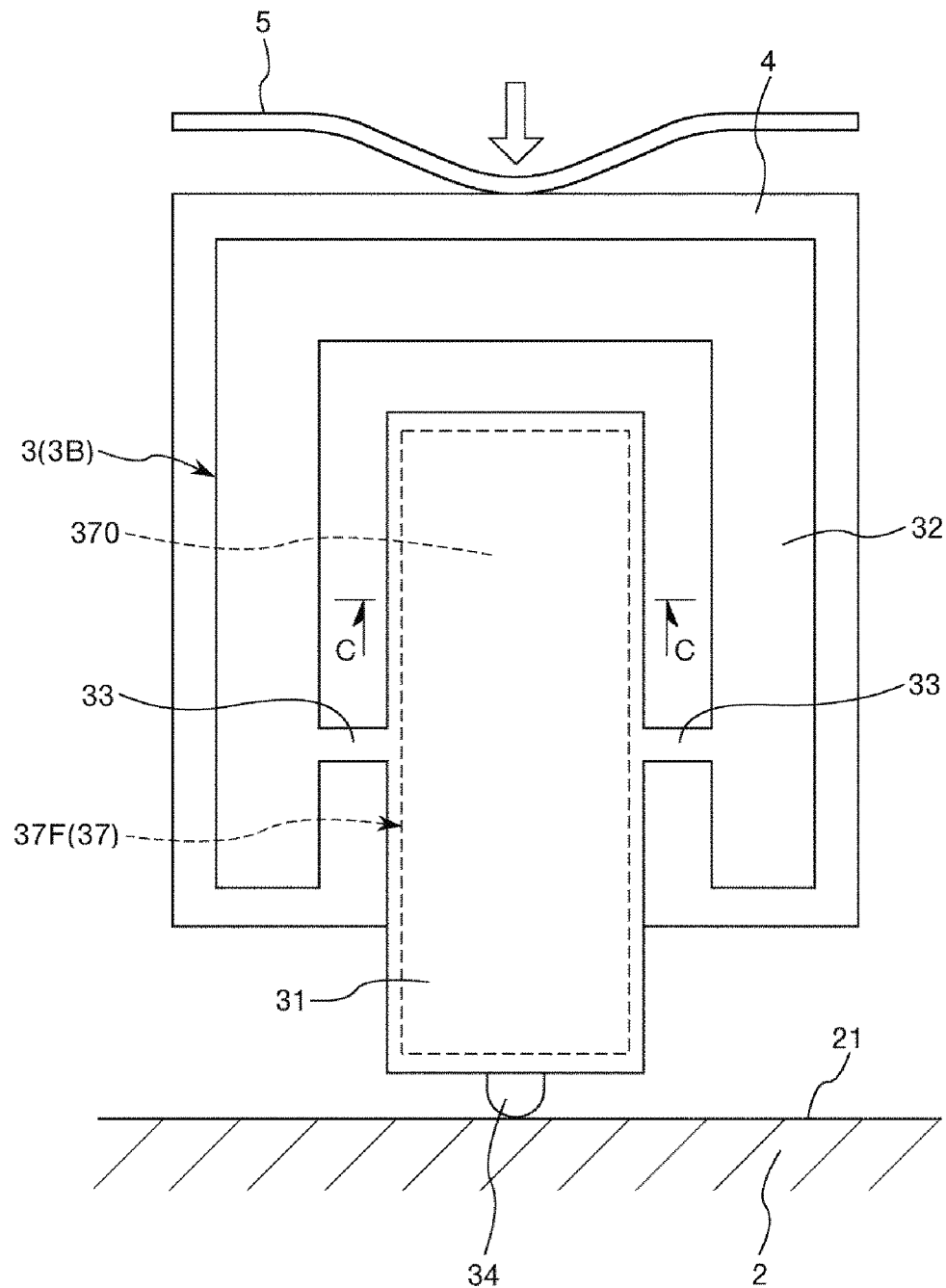
FIG. 14 is a plan view of a second piezoelectric vibration module included in a piezoelectric drive device according to a second embodiment of the invention.
Figure 15:
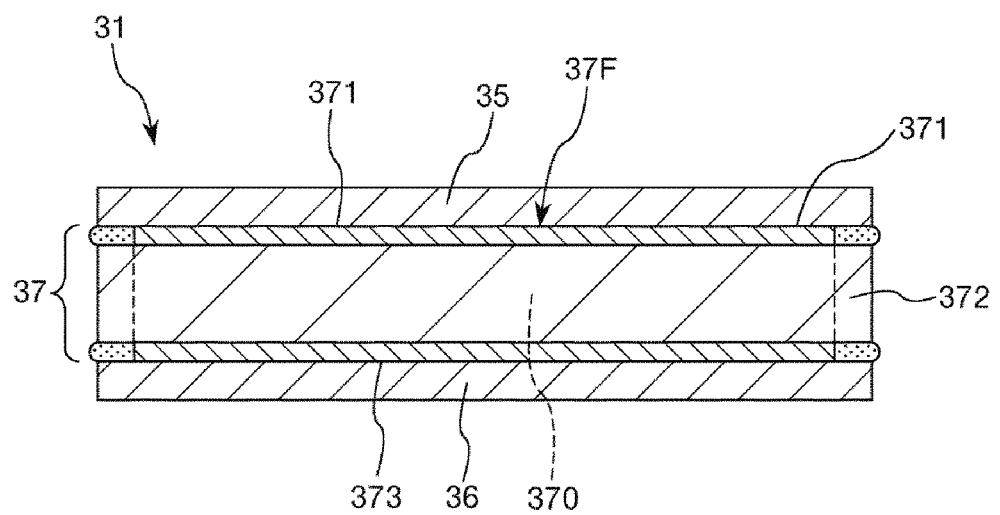
FIG. 15 is a cross-sectional view taken along line C-C in FIG. 14.

FIG. 14 is a plan view of a second piezoelectric vibration module included in the piezoelectric drive device according to the second embodiment of the invention. FIG. 15 is a cross-sectional view taken along line C-C in FIG. 14.

Hereinafter, the difference between the piezoelectric drive device of the second embodiment and that of the first embodiment described above will be mainly described, and description of similar matters will be omitted.

The piezoelectric drive device according to the second embodiment of the invention is substantially the same as the first embodiment described above except that the configuration of the second piezoelectric vibration module is different. The same reference numerals are given to the same configurations as those in the first embodiment described above.

In the piezoelectric drive device 1 of the second embodiment, the first piezoelectric vibration module 3A and the second piezoelectric vibration module 3B have different configurations. The configuration of the first piezoelectric vibration module 3A is the same as that of the first embodiment described above and thus, the configuration of the second piezoelectric vibration module 3B will be described below.

The configuration of the piezoelectric element 37 of the second piezoelectric vibration module 3B is different from that of the first embodiment described above. As illustrated in FIG. 14, in the second piezoelectric vibration module 3B of the second embodiment, the piezoelectric element 37 has one piezoelectric element 37F disposed so as to spread over substantially the entire region of the vibration portion 31. As illustrated in FIG. 15, the piezoelectric element 37F includes a piezoelectric body 372, a first electrode 371 provided on the upper surface of the piezoelectric body 372, and a second electrode 373 provided on the lower surface of the piezoelectric body 372. Accordingly, a region sandwiched between the first electrode 371 and the second electrode 373 of the piezoelectric body 372 corresponds to the vibration region 370. In the second piezoelectric vibration module 3B having such a configuration, the voltage V4 illustrated in FIG. 7 is applied to the piezoelectric element 37F so as to make it possible to perform the longitudinal vibration mode. That is, the piezoelectric element 37F performs expanding and contracting vibration and the transmission portion 34 performs longitudinal vibration.

The area of the vibration region 370 of the piezoelectric element 37F that causes longitudinal vibration in the second piezoelectric vibration module 3B is greater than the area of the vibration region 370 of the piezoelectric element 37C that causes longitudinal vibration in the first piezoelectric vibration module 3A. For that reason, when magnitudes of the drive voltages are the same, amplitude of the longitudinal vibration of the transmission portion 34 of the second piezoelectric vibration module 3B becomes greater than amplitude of the longitudinal vibration of the transmission portion 34 of the first piezoelectric vibration module 3A. With this, it is possible to more reliably lower the frictional force between the second piezoelectric vibration module 3B and the rotor 2 at the drive mode. In the second embodiment, the area of the vibration region 370 of the piezoelectric element 37F is approximately three times the area of the vibration region 370 of the piezoelectric element 37C and thus, the amplitude of the longitudinal vibration of the transmission portion 34 of the second piezoelectric vibration module 3B is approximately three times the amplitude of the longitudinal vibration of the transmission portion 34 of the first piezoelectric vibration module 3A.

The piezoelectric drive device 1 of the second embodiment has been described as above. In such a piezoelectric drive device 1, as described above, the vibration portion 31 of the first piezoelectric vibration module 3A and the vibration portion 31 of the second piezoelectric vibration module 3B have configurations different from each other. With this, it is possible for each of the first piezoelectric vibration module 3A and the second piezoelectric vibration module 3B to have a suitable configuration and thus, the piezoelectric drive device 1 can be driven more efficiently. The "different configuration" means that the first piezoelectric vibration module 3A can vibrate in the longitudinal vibration mode and the rotational vibration mode, but the second piezoelectric vibration module 3B can vibrate in the longitudinal vibration mode but cannot vibrate in the rotational vibration mode, and other configurations are not particularly limited. For example, one of the first piezoelectric vibration module 3A and the second piezoelectric vibration module 3B may not have the support portion 32 and the connection portion 33, or may have a different shape.

As described above, in the piezoelectric drive device 1 of the present embodiment, the area of the vibration region 370 (vibration region 370 of the piezoelectric element 37F) which causes longitudinal vibration of the second piezoelectric vibration module 3B is greater than the area of the vibration region 370 (vibration region 370 of the piezoelectric element 37C) which causes longitudinal vibration of the first piezoelectric vibration module 3A. For that reason, the amplitude of the longitudinal vibration of the transmission portion 34 of the second piezoelectric vibration module 3B becomes greater than the amplitude of the longitudinal vibration of the transmission portion 34 of the first piezoelectric vibration module 3A. With this, it is possible to more reliably reduce the frictional force between the second piezoelectric vibration module 3B and the rotor 2 by causing the second piezoelectric vibration module 3B to longitudinally vibrate.

Here, although the area of the vibration region 370 of the piezoelectric element 37F is not particularly limited, when the area of the vibration region 370 of the piezoelectric element 37F is set to M2 and the area of the vibration region 370 of the piezoelectric element 37C is set to M1, it is preferable that $2 \leq M2/M1 \leq 10$ is satisfied, and it is more preferable that $3 \leq M2/M1 \leq 5$ is satisfied. With this, it is possible to make the area M2 sufficiently large, and it is possible to lower the frictional force between the second piezoelectric vibration module 3B and the rotor 2 suffi- ciently and more reliably by causing the second piezoelectric vibration module 3B to longitudinally vibrate. In addition, it is possible to prevent the area M2 from becoming excessively large, for example, it is possible to suppress excessive increase in size of the second piezoelectric vibration module 3B.

In Particular, in the second embodiment, the second piezoelectric vibration module 3B has one vibration region 370. With this, it is possible to provide a larger vibration region 370 in the vibration portion 31, and it is possible to further increase the amplitude of the longitudinal vibration of the second piezoelectric vibration module 3B.

According to the second embodiment as described above, the same effects as those of the first embodiment described above can be exhibited.

Third Embodiment

Next, a piezoelectric drive device according to a third embodiment of the invention will be described.

Figure 16:
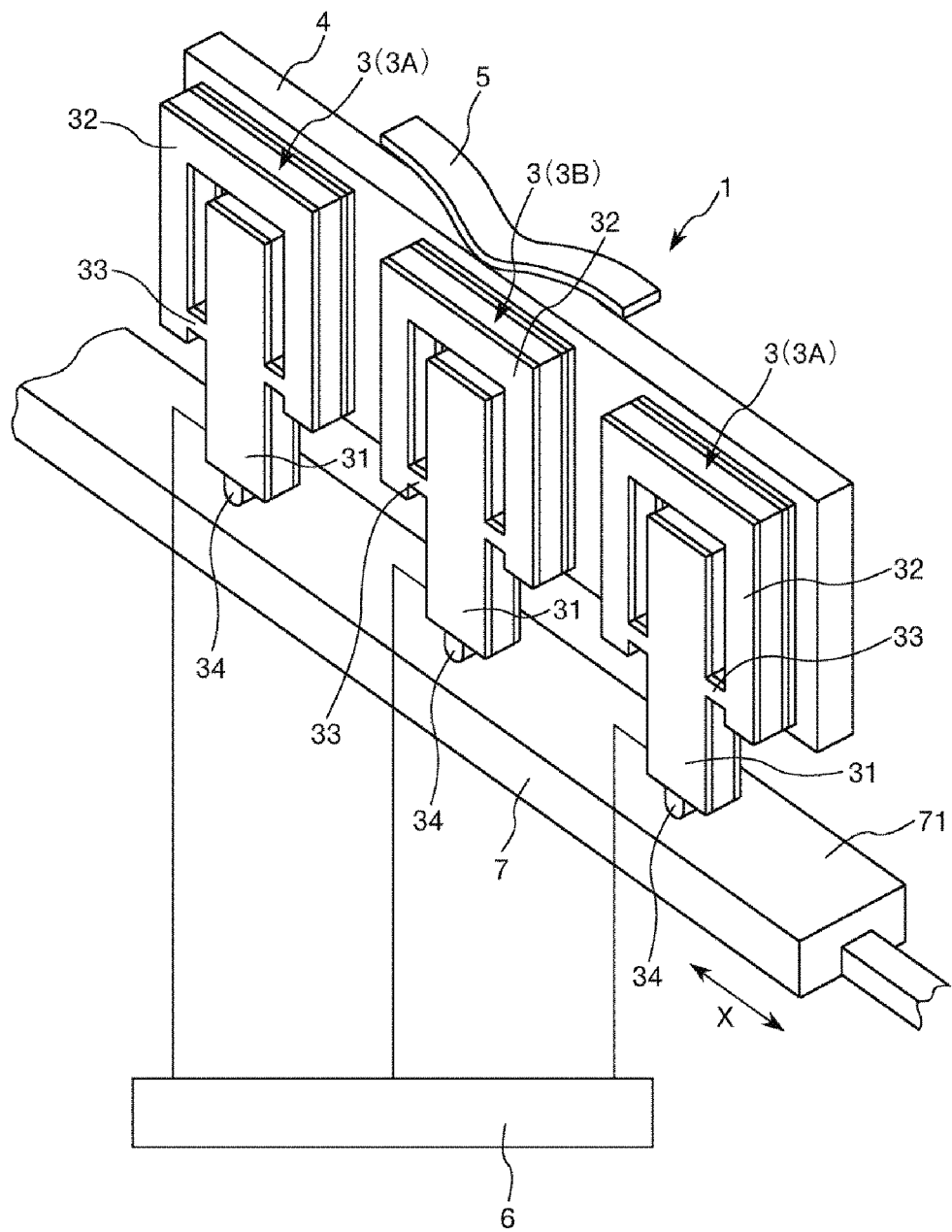
FIG. 16 is a perspective view illustrating a piezoelectric drive device according to a third embodiment of the invention.

FIG. 16 is a perspective view illustrating a piezoelectric drive device according to a third embodiment of the invention.

Hereinafter, the piezoelectric drive device 1 of the third embodiment will be described mainly on differences from the embodiments described above, and description of similar matters will be omitted.

The piezoelectric drive device according to the third embodiment of the invention is substantially the same as the first embodiment described above except that the configuration of the driven portion is different. The same reference numerals are given to the same configurations as those in the embodiments described above.

As illustrated in FIG. 16, the piezoelectric drive device 1 of the third embodiment is used as a linear motor, and includes a slider 7 (driven portion) linearly movable along a direction X, a plurality of piezoelectric vibration modules (first piezoelectric vibration module 3A and second piezoelectric vibration module 3B) that abut on the upper surface 71 of the slider 7, a stage 4 that supports the plurality of piezoelectric vibration modules 3, an urging portion 5 that urges the piezoelectric vibration module 3 toward the rotor 2 via the stage 4, and a control unit 6 that independently controls driving of each piezoelectric vibration module 3. Also, in the piezoelectric drive device 1 having such a configuration, similarly as in the first embodiment described above, at the drive mode, the first piezoelectric vibration module 3A is driven in the forward rotation vibration mode (reverse rotation vibration mode) and the second piezoelectric vibration module 3B is driven in the longitudinal vibration mode so as to make it possible to move the slider 7 in the direction X.

The slider 7 is in the form of a plate and can be reciprocated substantially only in the direction X by a rail (guide member) or the like. However, the configuration of the slider 7 is not particularly limited. The plurality of piezoelectric vibration modules 3 (two first piezoelectric vibration modules 3A and one second piezoelectric vibration module 3B) are disposed on the upper surface 71 of the slider 7 by being abutted with the upper surface 71 of the slider 7. The plurality of piezoelectric vibration modules 3 are disposed along the direction X (moving direction of the slider 7).

Also, according to the third embodiment as described above, the same effects as those in the first embodiment described above can be exhibited.

Fourth Embodiment

Next, a robot according to a fourth embodiment of the invention will be described.

Figure 17:
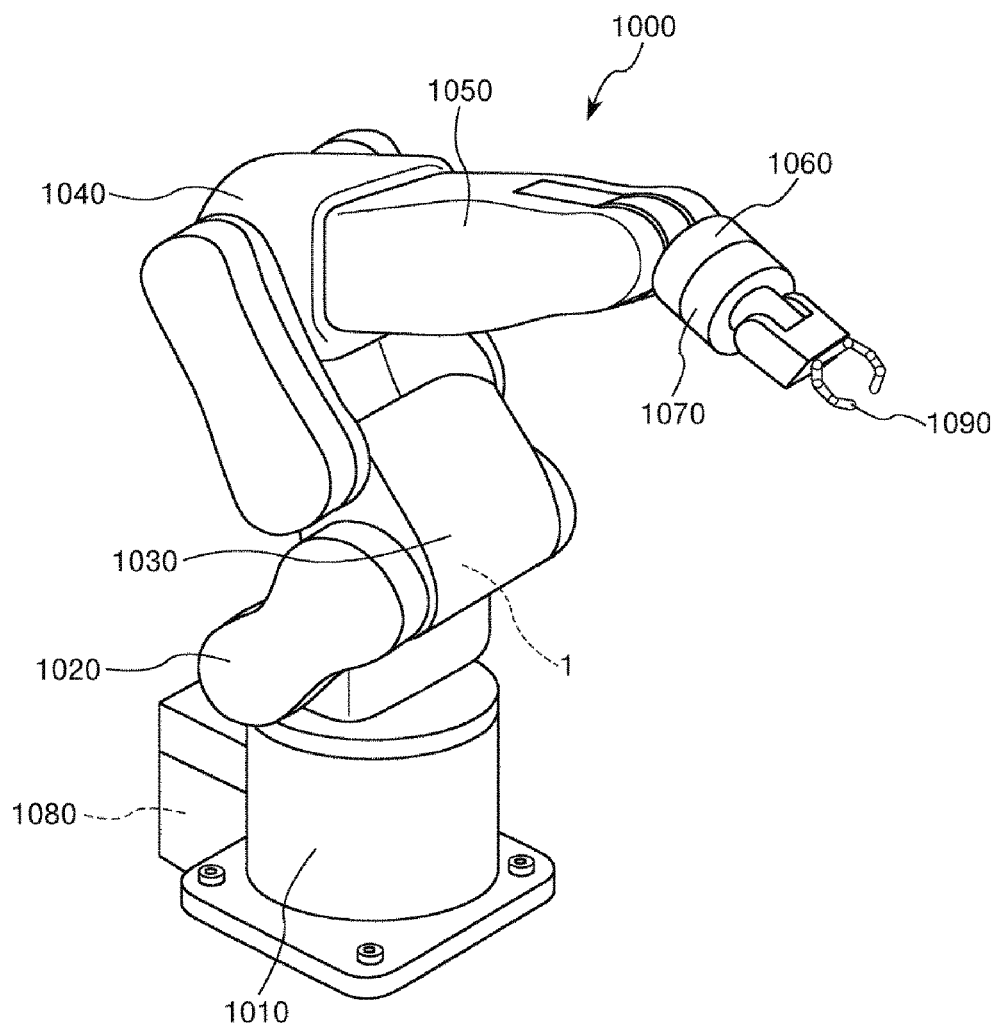
FIG. 17 is a perspective view illustrating a robot according to a fourth embodiment of the invention.

FIG. 17 is a perspective view illustrating a robot according to a fourth embodiment of the invention.

A robot 1000 illustrated in FIG. 17 can perform work such as feeding of material, removing of material, transporting of material, and assembling of material for precision equipment and parts constituting the precision equipment. The robot 1000 is a six-shaft robot, and includes a base 1010 fixed to a floor or a ceiling, an arm 1020 rotatably connected to the base 1010, an arm 1030 rotatably connected to the arm 1020, an arm 1040 rotatably connected to the arm 1030, an arm 1050 rotatably connected to the arm 1040, an arm 1060 rotatably connected to the arm 1050, an arm 1070 rotatably connected to the arm 1060, and a robot control unit 1080 for controlling driving of the arms 1020, 1030, 1040, 1050, 1060, and 1070. A hand connection portion is provided on the arm 1070, and an end effector 1090 according to the work to be executed by the robot 1000 is mounted on the hand connection portion. The piezoelectric drive device 1 is mounted on all or some of the respective joint portions, and the arms 1020, 1030, 1040, 1050, 1060, and 1070 are rotated by driving of the piezoelectric drive device 1. Driving of each piezoelectric drive device 1 is controlled by the robot control unit 1080. In addition, the piezoelectric drive device 1 may be mounted on the end effector 1090 and used for driving the end effector 1090.

Such a robot 1000 has the piezoelectric drive device 1. For that reason, it is possible to achieve the effects of the piezoelectric drive device 1 described above and to exhibit high reliability.

Fifth Embodiment

Next, an electronic component transport apparatus according to a fifth embodiment of the invention will be described.

Figure 18:
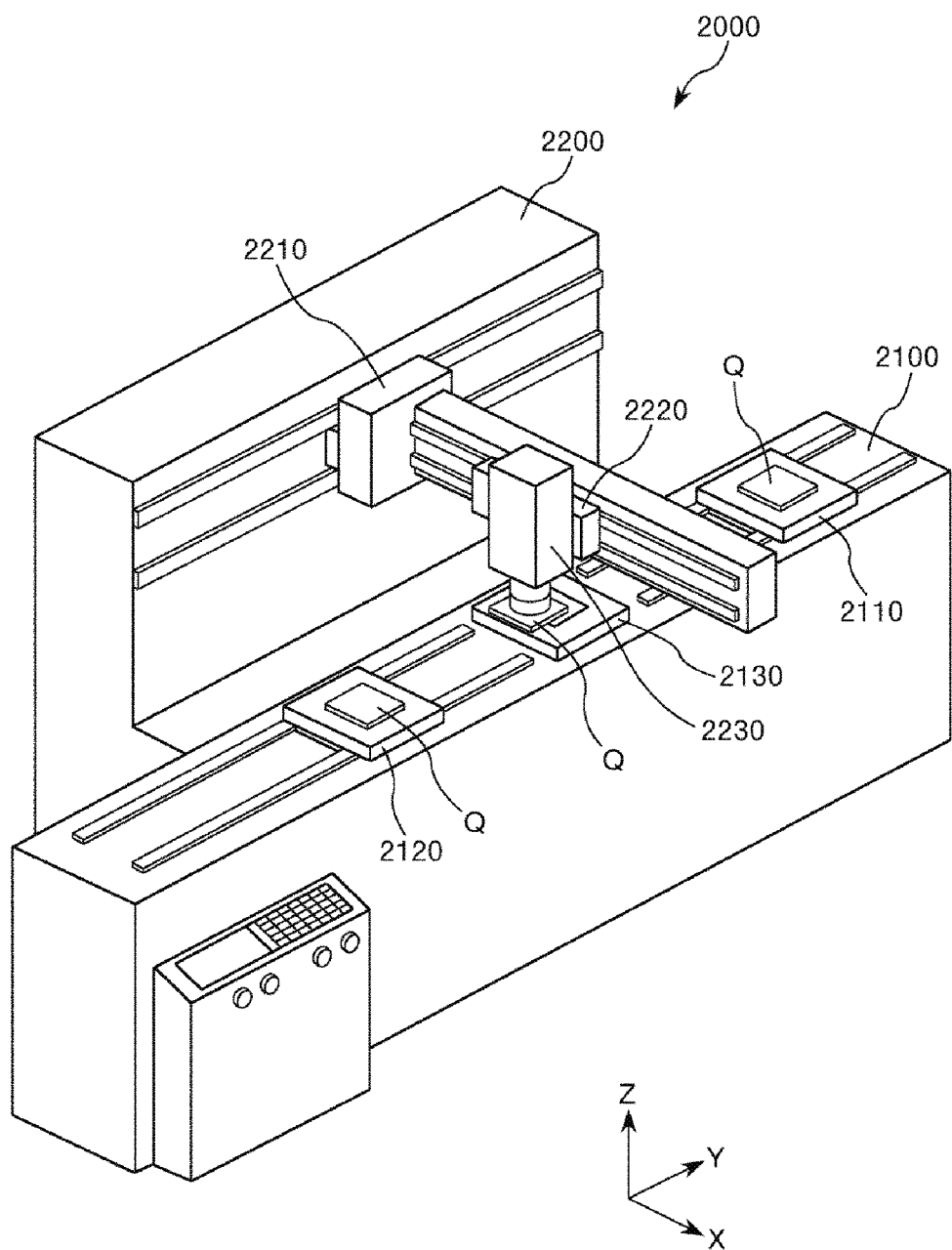
FIG. 18 is a perspective view illustrating an electronic component transport apparatus according to a fifth embodiment of the invention.
Figure 19:
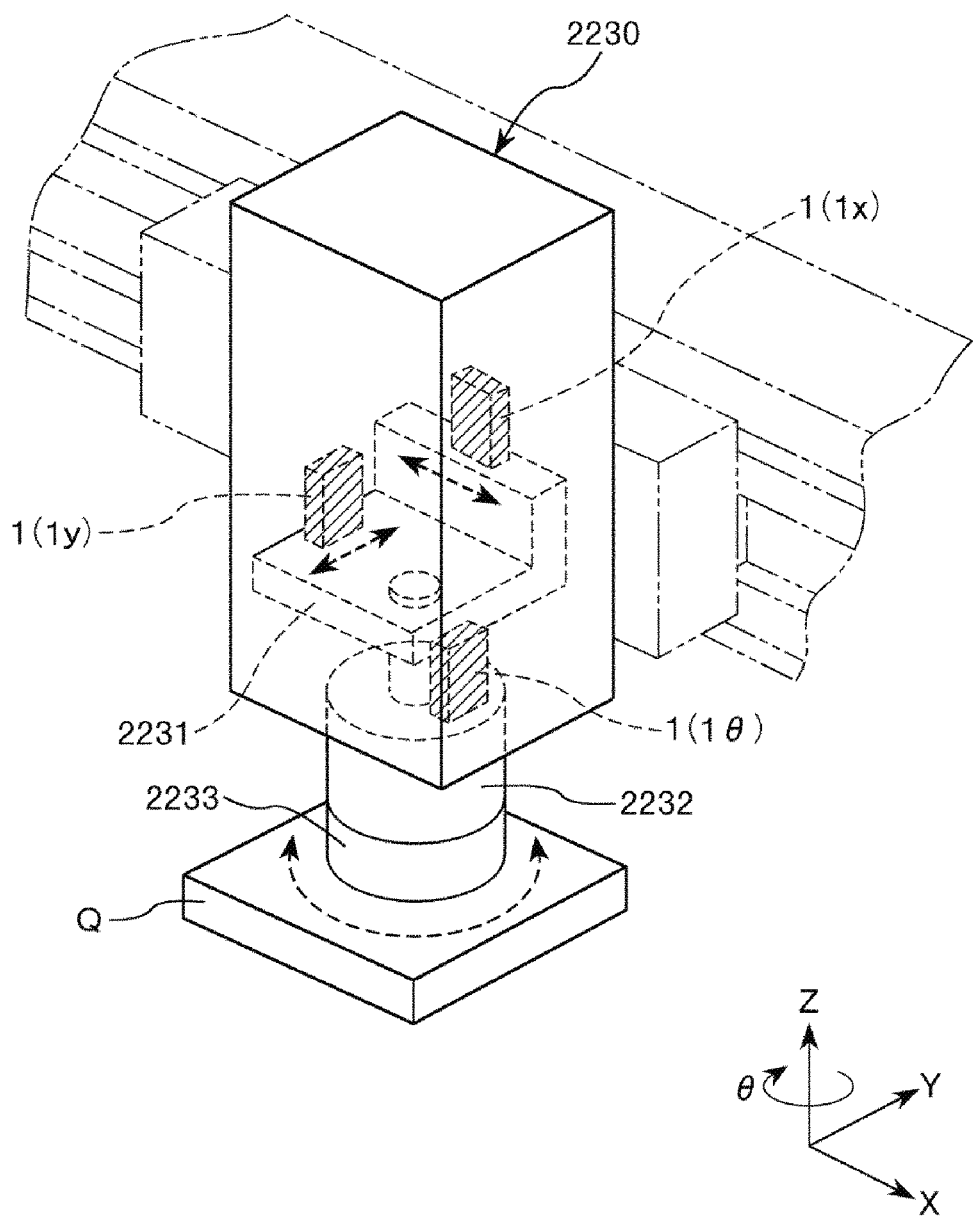
FIG. 19 is a perspective view illustrating an electronic component holding portion included in the electronic component transport apparatus illustrated in FIG. 18.

FIG. 18 is a perspective view illustrating an electronic component transport apparatus according to a fifth embodiment of the invention. FIG. 19 is a perspective view illustrating an electronic component holding portion included in the electronic component transport apparatus illustrated in FIG. 18. In the following description, three axes orthogonal to each other are referred to as an X-axis, a Y-axis, and a Z-axis for convenience of explanation.

An electronic component transport apparatus 2000 illustrated in FIG. 18 is applied to an electronic component inspection apparatus, and includes a base 2100 and a support stand 2200 disposed on a side of the base 2100. Further, on the base 2100, an upstream stage 2110 on which an electronic component Q to be inspected is mounted and transported in the Y-axis direction and a downstream stage 2120 on which an inspected electronic component Q is mounted and transported in the Y-axis direction, and an inspection table 2130 which is positioned between the downstream stage 2120 and the upstream stage 2110 and on which electrical characteristics of the electronic component Q is inspected are provided. Examples of the electronic component Q include a semiconductor, a semiconductor wafer, a display device such as a CLD and an OLED, a quartz crystal device, various sensors, an ink jet head, various MEMS devices, and the like.

A Y-stage 2210 movable in the Y axis direction with respect to the support stand 2200 is provided on the support stand 2200, an X-stage 2220 movable in the X-axis direction with respect to the Y-stage 2210 provided on the Y-stage 2210, and an electronic component holding portion 2230 movable in the Z-axis direction with respect to the X-stage 2220 is provided on the X-stage 2220.

As illustrate in FIG. 19, the electronic component holding portion 2230 includes a fine adjustment plate 2231 movable in the X axis direction and the Y axis direction, and a rotating portion 2232 rotatable about the Z-axis with respect to the fine adjustment plate 2231, and a holding portion 2233 which is provided in the rotating portion 2232 and holds the electronic component Q. The electronic component holding portion 2230 is provided with the piezoelectric drive device 1 (1x) for moving the fine adjustment plate 2231 in the X-axis direction, the piezoelectric drive device 1 (1y) for moving the fine adjustment plate 2231 in the Y-axis direction, and the piezoelectric drive device 1 (1θ) for rotating the rotating portion 2232 around the Z-axis. As the piezoelectric drive devices 1x and 1y, those of the third embodiment described above can be used and as the piezoelectric drive device 1θ described above, those of the first and second embodiments can be used.

Such an electronic component transport apparatus 2000 includes the piezoelectric drive device 1. For that reason, it is possible to achieve the effects of the piezoelectric drive device 1 described above and to exhibit high reliability.

Sixth Embodiment

Next, a printer according to a sixth embodiment of the invention will be described.

Figure 20:
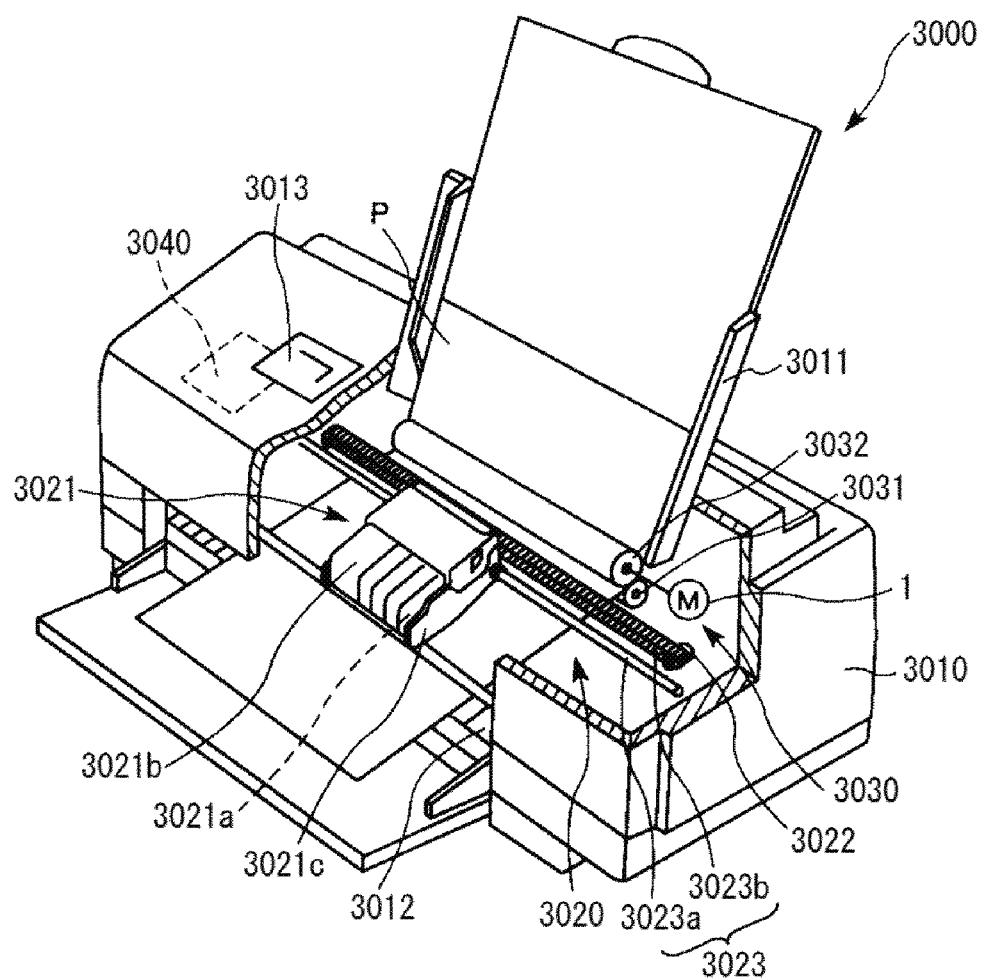
FIG. 20 is a schematic diagram illustrating an overall configuration of a printer according to a sixth embodiment of the invention.

FIG. 20 is a schematic diagram illustrating the overall configuration of a printer according to a sixth embodiment of the invention.

A printer 3000 illustrated in FIG. 20 includes an apparatus main body 3010, a printing mechanism 3020 provided inside the apparatus main body 3010, a sheet feed mechanism 3030, and a control unit 3040. The apparatus main body 3010 is provided with a tray 3011 for placing a recording sheet P, a sheet discharge port 3012 for discharging the recording sheet P, and an operation panel 3013 such as a liquid crystal display.

The printing mechanism 3020 includes a head unit 3021, a carriage motor 3022, and a reciprocating mechanism 3023 for reciprocating the head unit 3021 by a drive force of the carriage motor 3022. The head unit 3021 includes a head 3021a which is an inkjet type recording head, an ink cartridge 3021b which supplies ink to the head 3021a, and a carriage 3021c on which the head 3021a and the ink cartridge 3021b are mounted.

The reciprocating mechanism 3023 includes a carriage guide shaft 3023a which reciprocatably supports the carriage 3021c and a timing belt 3023b for moving the carriage 3021c on the carriage guide shaft 3023a by the drive force of the carriage motor 3022.

The sheet feed mechanism 3030 includes a driven roller 3031 and a driving roller 3032 that are in pressure contact with each other and a piezoelectric drive device 1 that is a sheet feeding motor that drives the driving roller 3032.

The control unit 3040 controls the printing mechanism 3020, the sheet feed mechanism 3030, and the like based on print data input from a host computer such as a personal computer.

In such a printer 3000, the sheet feed mechanism 3030 intermittently feeds the recording paper P one by one to the vicinity of the lower portion of the head unit 3021. At this time, the head unit 3021 reciprocates in a direction substantially orthogonal to the feeding direction of the recording paper P and printing on the recording paper P is performed.

Such a printer 3000 includes the piezoelectric drive device 1. For that reason, it is possible to achieve the effects of the piezoelectric drive device 1 described above and to exhibit high reliability. In the sixth embodiment, the piezoelectric drive device 1 drives the paper feed driving roller 3032, but in addition to this, for example, may also drive the carriage 3021c.

Seventh Embodiment

Next, a projector according to a seventh embodiment of the invention will be described.

Figure 21:
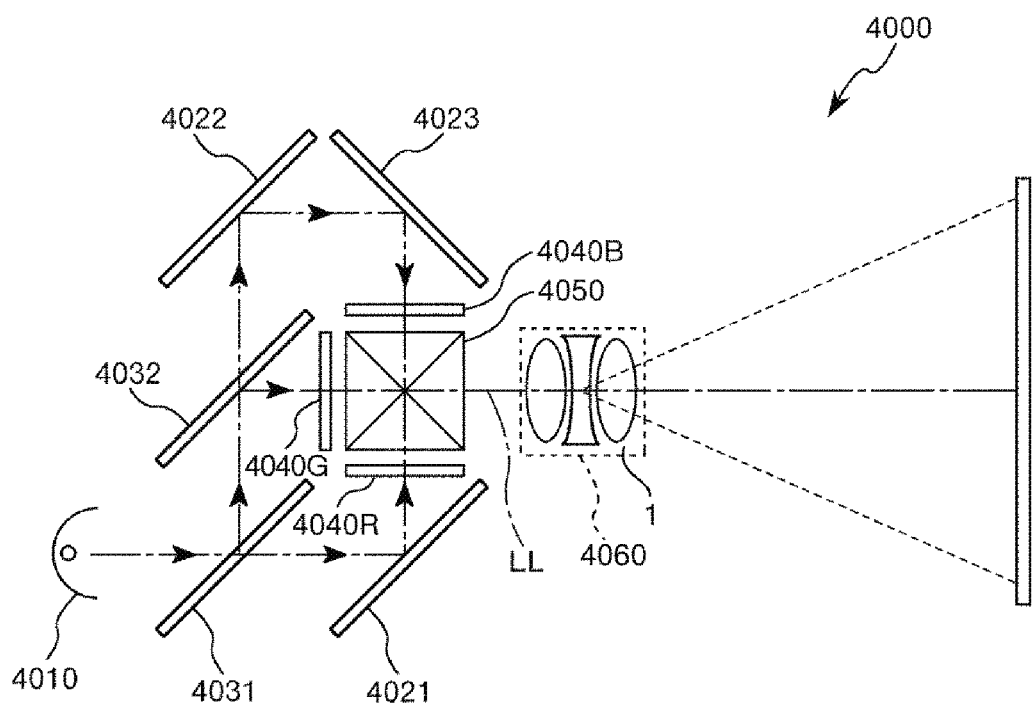
FIG. 21 is a schematic diagram illustrating an overall configuration of a projector according to a seventh embodiment of the invention.

FIG. 21 is a schematic diagram illustrating the overall configuration of a projector according to a seventh embodiment of the invention.

A projector 4000 illustrated in FIG. 21 is an LCD type projector and includes a light source 4010, mirrors 4021, 4022, and 4023, dichroic mirrors 4031 and 4032, liquid crystal display elements 4040R, 4040G, 4040B, a dichroic prism 4050, a projection lens system 4060, and the piezoelectric drive device 1.

As the light source 4010, for example, a halogen lamp, a mercury lamp, a light emitting diode (LED), and the like are included. As the light source 4010, one that emits white light is used. Then, light emitted from the light source 4010 is first separated into red light (R) and other light beams by the dichroic mirror 4031. After being reflected by the mirror 4021, red light enters the liquid crystal display element 4040R, and the other light beams are further separated into green light (G) and blue light (B) by the dichroic mirror 4032. Then, green light (G) enters the liquid crystal display element 4040G and blue light (B) is reflected by the mirrors 4022 and 4023 and then enters the liquid crystal display element 4040B.

Each of the liquid crystal display elements 4040R, 4040G, 4040B is used as a spatial light modulator. These liquid crystal display elements 4040R, 4040G, and 4040B are transmissive spatial light modulators corresponding to primary colors of R, G, and B, respectively, and have pixels arrayed in a matrix of, for example, 1080 rows in the vertical direction and 1920 columns in the horizontal direction. In each pixel, an amount of transmitted light with respect to incident light is adjusted, and light amount distribution of all the pixels is cooperatively controlled in each of the liquid crystal display elements 4040R, 4040G, and 4040B. Light beams spatially modulated by the liquid crystal display elements 4040R, 4040G, and 4040B are synthesized in the dichroic prism 4050, and full color image light LL is emitted from the dichroic prism 4050. Then, the emitted image light LL is enlarged and projected onto, for example, a screen or the like, by the projection lens system 4060. The piezoelectric drive device 1 can change a focal length by moving at least one lens included in the projection lens system 4060 in an optical axis direction.

Such a projector 4000 includes the piezoelectric drive device 1. For that reason, it is possible to achieve the effects of the piezoelectric drive device 1 described above and to exhibit high reliability.

Although the piezoelectric drive device, the drive method of the piezoelectric drive device, the robot, the electronic component transport apparatus, the printer, and the projector according to the invention have been described based on the illustrated embodiments, the invention is not limited thereto and the configuration of each of the portions and units can be replaced with any configuration having the same function. Further, any other component may be added to the invention. Embodiments described above may be appropriately combined.

In the embodiments described above, although the configurations in which the piezoelectric drive device is applied to the robot, the electronic component transport apparatus, the printer, and the projector are described, the piezoelectric drive device can also be applied to various electronic devices other than those described above.

The entire disclosure of Japanese Patent Application No. 2017-070930, filed Mar. 31, 2017 is expressly incorporated by reference herein.

What is claimed is:

1. A piezoelectric drive device comprising:
a first piezoelectric vibration module and a second piezoelectric vibration module each of which is pressed toward a driven portion and includes a vibration portion and a transmission portion which abuts the driven portion and transmits vibration of the vibration portion to the driven portion; and
a control unit,
wherein a pressing force of the second piezoelectric vibration module to the driven portion is greater than the pressing force of the first piezoelectric vibration module to the driven portion, and
the control unit drives the second piezoelectric vibration module in such a way that the transmission portion of the second piezoelectric vibration module performs longitudinal vibration vibrating in a pressing direction while driving the first piezoelectric vibration module in such a way that the transmission portion of the first piezoelectric vibration module performs bending vibration that is composite vibration of longitudinal vibration vibrating in the pressing direction and lateral vibration vibrating in a direction intersecting the pressing direction.

2. The piezoelectric drive device according to claim 1,
wherein in a state of being not pressed to the driven portion, amplitude of the longitudinal vibration of the transmission portion of the second piezoelectric vibration module is greater than amplitude of the longitudinal vibration of the transmission portion of the first piezoelectric vibration module.

3. The piezoelectric drive device according to claim 1,
wherein the vibration portions of the first piezoelectric vibration module and the vibration portion of the second piezoelectric vibration module have the same configuration.

4. The piezoelectric drive device according to claim 3,
wherein the first piezoelectric vibration module and the second piezoelectric vibration module have at least a pair of vibration regions which is disposed in the vibration portion and disposed side by side in a direction intersecting the pressing direction,
the first piezoelectric vibration module expands and contracts the pair of vibration regions at different phases to cause the transmission portion to perform the bending vibration, and
the second piezoelectric vibration module expands and contracts the pair of vibration regions at the same phase to cause the transmission portion to perform the longitudinal vibration.

5. The piezoelectric drive device according to claim 1,
wherein the vibration portion of the first piezoelectric vibration module and the vibration portion of the second piezoelectric vibration module have configurations different from each other.

6. The piezoelectric drive device according to claim 5, wherein an area of the vibration region that causes the longitudinal vibration of the second piezoelectric vibration module is greater than the area of the vibration region that causes the longitudinal vibration of the first piezoelectric vibration module.

7. The piezoelectric drive device according to claim 6, wherein the second piezoelectric vibration module has one vibration region.

8. The piezoelectric drive device according to claim 1, wherein the control unit has a first mode in which the driven portion is moved by causing the transmission portion of the second piezoelectric vibration module to perform the longitudinal vibration while causing the transmission portion of the first piezoelectric vibration module to perform the bending vibration, and a second mode in which driving of the first piezoelectric vibration module and the second piezoelectric vibration module is stopped and the driven portion is held by the first piezoelectric vibration module and the second piezoelectric vibration module.

9. The piezoelectric drive device according to claim 8, wherein the control unit has a third mode in which movement of the driven portion is allowed by causing the transmission portion of the first piezoelectric vibration module and the transmission portion of the second piezoelectric vibration module to perform the longitudinal vibration.

10. A drive method of a piezoelectric drive device which includes a first piezoelectric vibration module and a second piezoelectric vibration module each of which is pressed toward a driven portion and includes a vibration portion and a transmission portion which abuts the driven portion and transmits vibration of the vibration portion to the driven portion, the method comprising:

in a state where a pressing force of the second piezoelectric vibration module to the driven portion is greater than the pressing force of the first piezoelectric vibration module to the driven portion, causing the driven portion to be driven by allowing the transmission portion of the first piezoelectric vibration module to perform bending vibration that is composite vibration of longitudinal vibration vibrating in a pressing direction and lateral vibration vibrating in a direction intersecting the pressing direction, and allowing the transmission portion of the second piezoelectric vibration module to perform longitudinal vibration that vibrates in the pressing direction.

11. A robot comprising:
the piezoelectric drive device according to claim 1.

12. A robot comprising:
the piezoelectric drive device according to claim 2.

13. A robot comprising:
the piezoelectric drive device according to claim 3.

14. An electronic component transport apparatus comprising:
the piezoelectric drive device according to claim 1.

15. An electronic component transport apparatus comprising:
the piezoelectric drive device according to claim 2.

16. An electronic component transport apparatus comprising:
the piezoelectric drive device according to claim 3.

17. A printer comprising:
the piezoelectric drive device according to claim 1.

18. A printer comprising:
the piezoelectric drive device according to claim 2.

19. A projector comprising:
the piezoelectric drive device according to claim 1.

20. A projector comprising:
the piezoelectric drive device according to claim 2.

* * * * *